(12) United States Patent
Sasaki

(10) Patent No.: US 11,515,095 B2
(45) Date of Patent: Nov. 29, 2022

(54) MULTI-LAYER CERAMIC ELECTRONIC COMPONENT AND CIRCUIT BOARD

(71) Applicant: TAIYO YUDEN CO., LTD., Tokyo (JP)

(72) Inventor: Takashi Sasaki, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 3 days.

(21) Appl. No.: 17/170,675

(22) Filed: Feb. 8, 2021

(65) Prior Publication Data
US 2021/0249194 A1   Aug. 12, 2021

(30) Foreign Application Priority Data

Feb. 12, 2020 (JP) .............................. JP2020-021215

(51) Int. Cl.
| | |
|---|---|
| H01G 4/005 | (2006.01) |
| H01G 4/12 | (2006.01) |
| H01G 4/232 | (2006.01) |
| H01G 4/30 | (2006.01) |
| H05K 1/18 | (2006.01) |
| H05K 3/34 | (2006.01) |

(52) U.S. Cl.
CPC ............... *H01G 4/30* (2013.01); *H01G 4/005* (2013.01); *H01G 4/12* (2013.01); *H01G 4/232* (2013.01); *H05K 1/181* (2013.01); *H05K 3/3442* (2013.01); *H05K 2201/09* (2013.01); *H05K 2201/10621* (2013.01)

(58) Field of Classification Search
CPC .......... H01G 4/005; H01G 4/12; H01G 4/232; H01G 4/30; H05K 1/181; H05K 3/3442; H05K 2201/10621
See application file for complete search history.

(56) References Cited

U.S. PATENT DOCUMENTS

| | | | |
|---|---|---|---|
| 2010/0214751 A1* | 8/2010 | Aoki ...................... | H05K 1/145 361/772 |
| 2014/0185189 A1 | 7/2014 | Kim et al. | |
| 2015/0084481 A1* | 3/2015 | Mori ...................... | H01G 4/252 29/829 |

(Continued)

FOREIGN PATENT DOCUMENTS

JP        2014130999 A      7/2014

*Primary Examiner* — Nathan Milakovich
(74) *Attorney, Agent, or Firm* — Law Office of Katsuhiro Arai

(57) ABSTRACT

A multi-layer ceramic electronic component includes: a ceramic body including first and second internal electrodes laminated in a first axis direction, first and second main surfaces facing in the first axis direction, and first and second end surfaces facing in a second axis direction orthogonal to the first axis, the first and second internal electrodes being drawn to those end surfaces; a first external electrode covering the first end surface and extending to the first main surface; and a second external electrode covering the second end surface and extending to the first main surface. Each external electrode includes a first region including a first outermost layer mainly containing tin and extending from the end surface to the first main surface, and a second region free from an outermost layer mainly containing tin and disposed adjacent to the first region in the first axis direction on the end surface.

11 Claims, 20 Drawing Sheets

(56) References Cited

U.S. PATENT DOCUMENTS

2015/0279562 A1* 10/2015 Nishisaka ............ H01G 4/1245
361/301.4
2019/0318874 A1* 10/2019 Orimo .................... H05K 1/181

* cited by examiner

MULTI-LAYER CERAMIC ELECTRONIC COMPONENT AND CIRCUIT BOARD

BACKGROUND ART

The present disclosure relates to a multi-layer ceramic electronic component such as a multi-layer ceramic capacitor and to a circuit board mounting the multi-layer ceramic electronic component.

Along with miniaturization of electronic devices, there are demands for a reduction in height of multi-layer ceramic electronic components. Japanese Patent Application Laid-open No. 2014-130999 discloses a low-height multi-layer ceramic capacitor including a ceramic main body, first and second internal electrodes disposed in the ceramic main body, and first and second external electrodes electrically connected to the first and second internal electrodes, respectively.

SUMMARY OF THE INVENTION

The multi-layer ceramic capacitor is mounted on a board by, for example, soldering of the external electrodes onto the board. In this case, the solder has spread upward in the height direction of the external electrode to reach the peripheral portion of the external electrode. Thus, the height dimension including the solder has been larger than the height dimension of the multi-layer ceramic electronic component, thus increasing the mounting space. Further, the height of the ceramic main body (ceramic body) and the number of laminated internal electrodes have been limited, thus hindering an achievement of high functionality such as an increase in capacitance.

In view of the circumstances as described above, it is desirable to provide a multi-layer ceramic electronic component capable of being mounted in a space-saving manner and also capable of achieving high functionality, and a circuit board mounting such a multi-layer ceramic electronic component.

Additional or separate features and advantages of the disclosure will be set forth in the descriptions that follow and in part will be apparent from the description, or may be learned by practice of the disclosure. The objectives and other advantages of the disclosure will be realized and attained by the structure particularly pointed out in the written description and claims thereof as well as the appended drawings.

To achieve these and other advantages and in accordance with the purpose of the present disclosure, as embodied and broadly described, in one embodiment, the present disclosure provides a multi-layer ceramic electronic component including a ceramic body, a first external electrode, and a second external electrode.

The ceramic body includes a first internal electrode and a second internal electrode laminated in a direction of a first axis, a first main surface and a second main surface facing in the direction of the first axis, a first end surface facing in a direction of a second axis orthogonal to the first axis, the first internal electrode being drawn to the first end surface, and a second end surface facing in the direction of the second axis, the second internal electrode being drawn to the second end surface.

The first external electrode covers the first end surface and extends to the first main surface.

The second external electrode covers the second end surface and extends to the first main surface.

Each of the first external electrode and the second external electrode includes a first region that includes a first outermost layer mainly containing tin and extends from the first end surface or the second end surface to the first main surface, and a second region that is free from an outermost layer mainly containing tin and is disposed adjacent to the first region in the direction of the first axis on the first end surface or the second end surface.

In the configuration described above, the first region includes the first outermost layer mainly containing tin, which is highly reactive with a solder, and is disposed to extend from the first end surface or the second end surface to the first main surface. Thus, at the time of mounting, the first main surface and a mounting board are disposed facing each other, so that the solder and the first outermost layer can satisfactorily react with each other in the vicinity of the first main surface, and the solder and the first and second external electrodes can be reliably bonded to each other. Additionally, in the configuration described above, the second region that is free from an outermost layer mainly containing tin is disposed adjacent to the first region in the direction of the first axis. Thus, in the second region, the solder can be suppressed from spreading upward along the direction of the first axis and from reaching the second main surface. Therefore, after the mounting, the height dimension of the multi-layer ceramic electronic component including the solder in the direction of the first axis can be regulated, and the multi-layer ceramic electronic component can be mounted in a space-saving manner. Further, the height dimension of the ceramic body in the direction of the first axis with respect to the mounting space can be satisfactorily ensured, and a highly-functional multi-layer ceramic electronic component can be achieved by using the mounting space to the maximum extent.

For example, the second region may include a second outermost layer free from tin as a main component.

This configuration allows the second outermost layer to suppress the reaction with the solder and suppress the solder from spreading upward. Therefore, the configuration described above can suppress the solder from reaching the second main surface, thus achieving space-saving mounting and a highly-functional multi-layer ceramic electronic component.

In this case, the first region may further include a first inner layer disposed on the ceramic body, the first outermost layer may be disposed on the first inner layer, and the second outermost layer may be formed continuously with at least a part of the first inner layer.

Thus, the second outermost layer is formed by the same step as that of at least the part of the first inner layer. Therefore, the production efficiency of the multi-layer ceramic electronic component can be enhanced.

Alternatively, the first region may further include a first inner layer disposed on the ceramic body.

The second region may further include a second inner layer disposed on the ceramic body and formed continuously with the first inner layer, and a tin-containing layer mainly containing tin, disposed on the second inner layer, and formed continuously with the first outermost layer.

The second outermost layer may be disposed on the tin-containing layer.

Thus, the first inner layer is formed by the same step as that of the second inner layer, and the first outermost layer is formed by the same step as that of the tin-containing layer. Therefore, the production efficiency of the multi-layer ceramic electronic component can be enhanced.

For example, the second region may extend along a direction of a third axis orthogonal to the first axis and the second axis on the first end surface or the second end surface.

This configuration allows the second region to come into contact with the solder spreading upward in the direction of the first axis in a wide range and can effectively suppress the solder from spreading upward.

The first external electrode may cover the first end surface and extend to the first main surface and the second main surface.

The second external electrode may cover the second end surface and extend to the first main surface and the second main surface.

The second region may be disposed at the center portion of each of the first external electrode and the second external electrode in the direction of the first axis.

The first region may extend from the first end surface or the second end surface to the first main surface and the second main surface.

With this configuration, in any of the case of mounting with the first main surface facing the mounting board and the case of mounting with the second main surface facing the mounting board, the effect of the second region to suppress the solder from spreading upward can be obtained. Therefore, the degree of freedom in mounting posture of the multi-layer ceramic electronic component can be enhanced.

Additionally, the center portion may be a region at the center when each of the first external electrode and the second external electrode is divided equally into three in the direction of the first axis.

The first external electrode may cover the first end surface and extend to the first main surface and the second main surface.

The second external electrode may cover the second end surface and extend to the first main surface and the second main surface.

The second region may extend from the first end surface or the second end surface to the second main surface.

This configuration allows the second region to be disposed in a wide range, and the solder can be more reliably prevented from reaching the second main surface in the case of mounting with the first main surface facing the mounting board.

In another embodiment, the present disclosure provides a circuit board including a mounting board, a multi-layer ceramic electronic component, and a solder.

The multi-layer ceramic electronic component includes a ceramic body, a first external electrode, and a second external electrode.

The ceramic body includes a first internal electrode and a second internal electrode laminated in a direction of a first axis, a first main surface and a second main surface facing in the direction of the first axis, a first end surface facing in a direction of a second axis orthogonal to the first axis, the first internal electrode being drawn to the first end surface, and a second end surface facing in the direction of the second axis, the second internal electrode being drawn to the second end surface.

The first external electrode covers the first end surface and extends to the first main surface.

The second external electrode covers the second end surface and extends to the first main surface.

The solder connects the first external electrode and the second external electrode to the mounting board.

Each of the first external electrode and the second external electrode includes a first region that includes a first outermost layer mainly containing tin and extends from the first end surface or the second end surface to the first main surface, and a second region that is free from an outermost layer mainly containing tin and is disposed adjacent to the first region in the direction of the first axis on the first end surface or the second end surface.

As described above, according to the present disclosure, it is possible to provide a multi-layer ceramic electronic component capable of being mounted in a space-saving manner and also capable of achieving high functionality, and a circuit board mounting such a multi-layer ceramic electronic component.

These and other objects, features and advantages of the present disclosure will become more apparent in light of the following detailed description of embodiments thereof, as illustrated in the accompanying drawings.

It is to be understood that both the foregoing general description and the following detailed description are exemplary and explanatory, and are intended to provide further explanation of the disclosure as claimed.

DETAILED DESCRIPTION OF THE EMBODIMENTS

Hereinafter, embodiments of the present disclosure will be described with reference to the drawings.

In the figures, an X axis, a Y axis, and a Z axis orthogonal to one another are shown as appropriate. The X axis, the Y axis, and the Z axis are common in all figures.

I First Embodiment

1. Overall Configuration of Multi-layer Ceramic Capacitor

Figure 1:
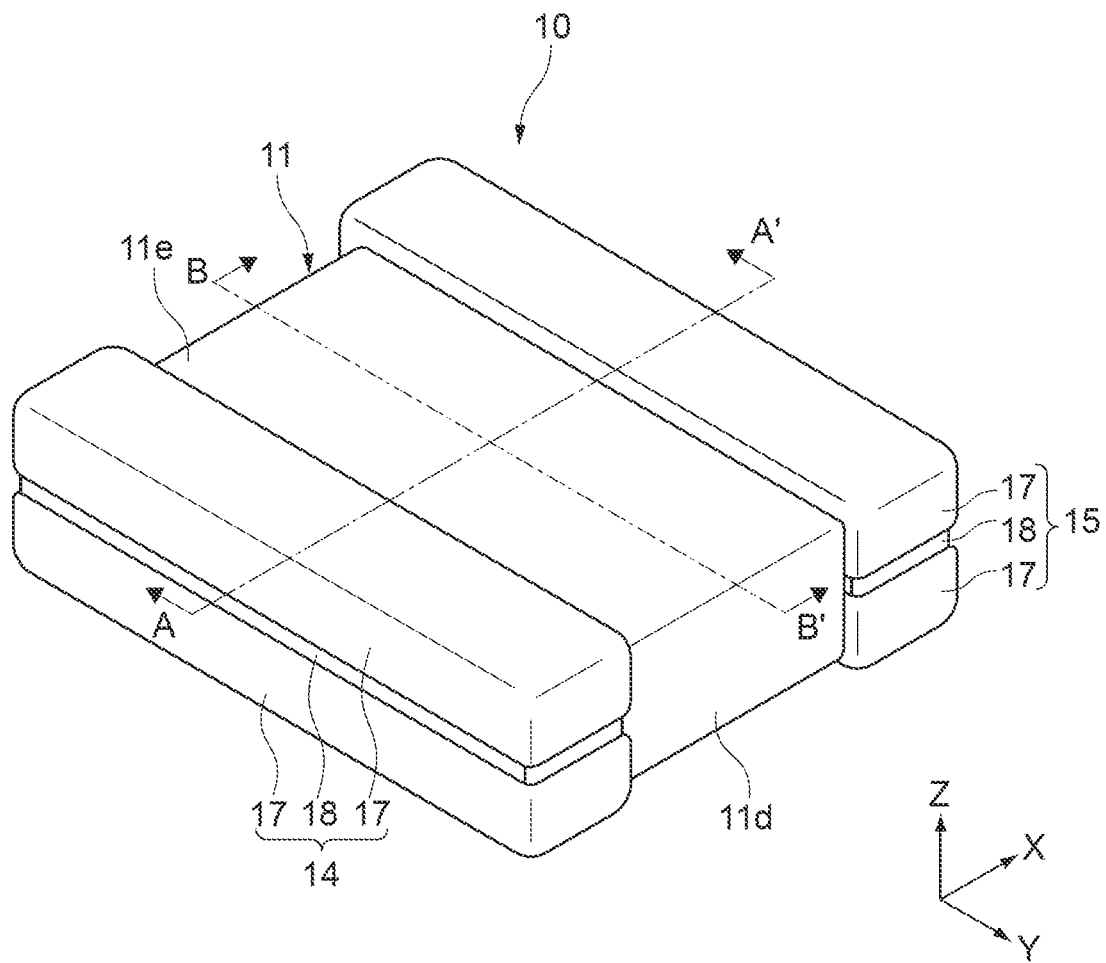
FIG. 1 is a schematic perspective view of a multi-layer ceramic electronic component according to a first embodiment of the present disclosure.
Figure 2:
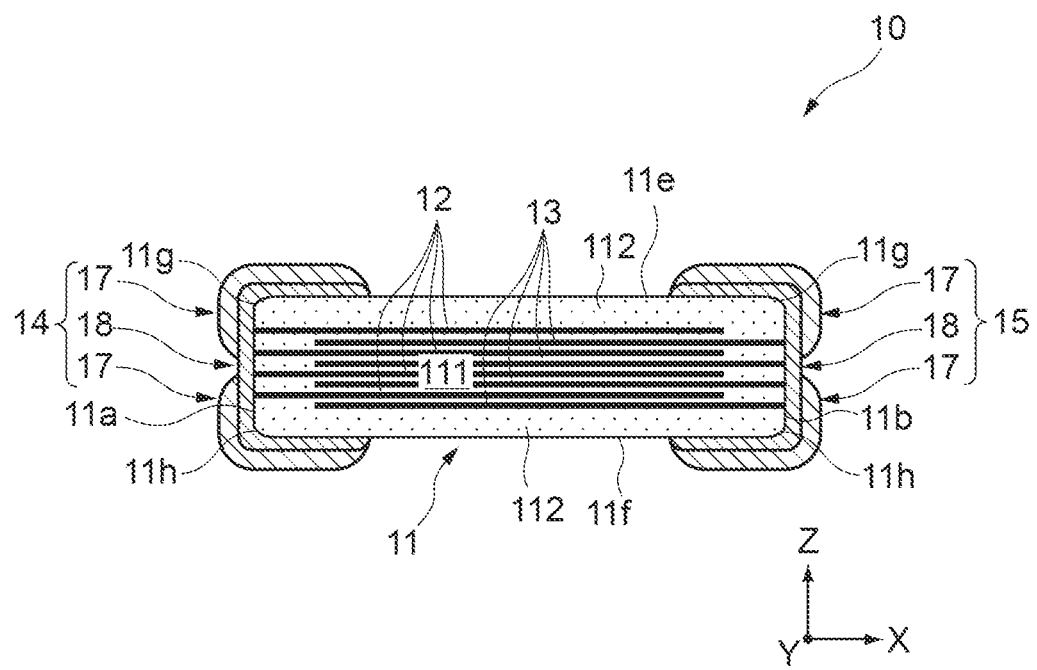
FIG. 2 is a cross-sectional view of the multi-layer ceramic electronic component taken along the line A-A' in FIG. 1.
Figure 3:
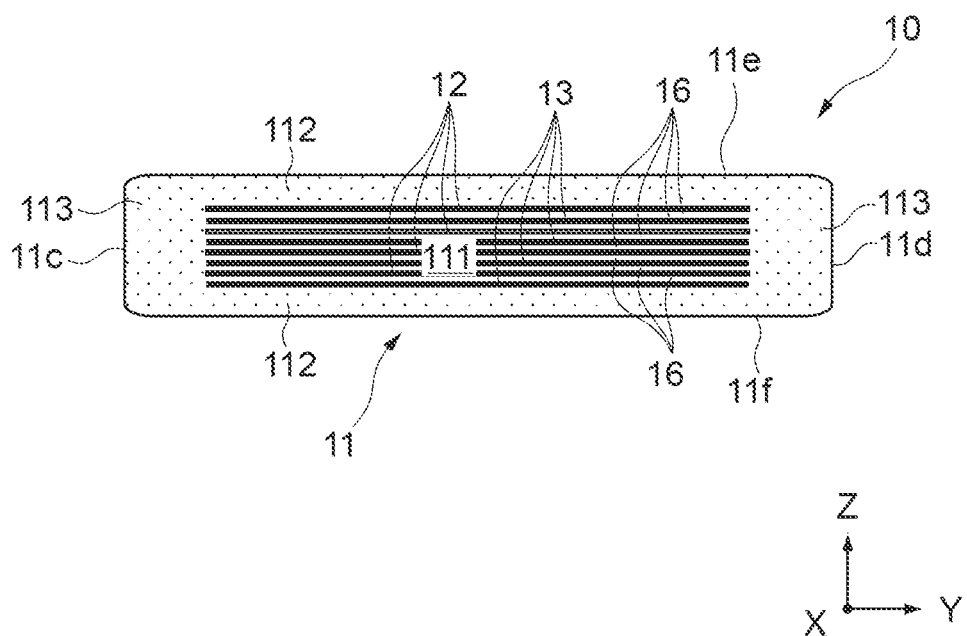
FIG. 3 is a cross-sectional view of the multi-layer ceramic electronic component taken along the line B-B' in FIG. 1.

FIGS. 1 to 3 each show a multi-layer ceramic capacitor 10 according to a first embodiment of the present disclosure. FIG. 1 is a perspective view of the multi-layer ceramic capacitor 10. FIG. 2 is a cross-sectional view of the multi-layer ceramic capacitor 10 taken along the line A-A' in FIG. 1. FIG. 3 is a cross-sectional view of the multi-layer ceramic capacitor 10 taken along the line B-B' in FIG. 1.

The multi-layer ceramic capacitor 10 includes a ceramic body 11, a first external electrode 14, and a second external electrode 15. Each of the first external electrode 14 and the second external electrode 15 is formed on the surface of the ceramic body 11.

The ceramic body 11 has a substantially hexahedral shape. In other words, the ceramic body 11 has a pair of end surfaces 11a and 11b (hereinafter, also referred to as first and second end surfaces 11a and 11b) facing in the X-axis direction, a pair of side surfaces 11c and 11d facing in the Y-axis direction, and a pair of main surfaces 11e and 11f (hereinafter, also referred to as first and second main surfaces 11e and 110 facing in the Z-axis direction. The end surfaces 11a and 11b extend along the Y- and Z-axis directions. The side surfaces 11c and 11d extend along the Z- and X-axis directions. The main surfaces 11e and 11f extend along the X- and Y-axis directions.

The end surfaces 11a and 11b, the side surfaces 11c and 11d, and the main surfaces 11e and 11f of the ceramic body 11 are each configured as a flat surface. The flat surface according to this embodiment does not need to be strictly flat if the surface may be recognized as being flat when viewed as a whole. For example, the flat surface according to this embodiment also includes a surface having fine irregularities thereon, a surface having a gently curved shape in a predetermined range, and the like.

The ceramic body 11 includes ridges that connect the surfaces to each other, for example. A ridge that connects the first main surface 11e and the first end surface 11a or the second end surface 11b to each other will be referred to as a first ridge 11g. A ridge that connects the second main surface 11f and the first end surface 11a or the second end surface 11b to each other will be referred to as a second ridge 11h. Each ridge may be chamfered, for example.

For the size of the multi-layer ceramic capacitor 10, for example, a dimension in the X-axis direction is 0.2 to 2.0 mm, and a dimension in the Y-axis direction is 0.2 to 2.0 mm. The longitudinal direction of the multi-layer ceramic capacitor 10 may be the X-axis direction or the Y-axis direction. In the example shown in FIGS. 1 to 3, the longitudinal direction of the multi-layer ceramic capacitor 10 is the Y-axis direction. A dimension of the multi-layer ceramic capacitor 10 in the Z-axis direction is, for example, 100 µm or less, and the multi-layer ceramic capacitor 10 is configured to have a low height. Note that each dimension of the multi-layer ceramic capacitor 10 is assumed as a dimension of a largest portion along each direction.

The ceramic body 11 includes a capacitance forming unit 111, covers 112, and side margins 113. The capacitance forming unit 111 is disposed at the center portion of the ceramic body 11 in the Y- and Z-axis directions. The covers 112 cover the capacitance forming unit 111 from the Z-axis direction, and the side margins 113 cover the capacitance forming unit 111 from the Y-axis direction.

More specifically, the covers 112 are disposed on both sides of the capacitance forming unit 111 in the Z-axis direction. The side margins 113 are disposed on both sides of the capacitance forming unit 111 in the Y-axis direction. The covers 112 and the side margins 113 have main functions of protecting the capacitance forming unit 111 and ensuring insulation properties of the periphery of the capacitance forming unit 111.

The capacitance forming unit 111 includes a plurality of first internal electrodes 12 and a plurality of second internal electrodes 13, which are alternately laminated in the Z-axis direction via ceramic layers 16 (see FIG. 3). The first and second internal electrodes 12 and 13 each have a sheet-like shape extending along the X- and Y-axis directions and are alternately laminated along the Z-axis direction.

The first and second internal electrodes 12 and 13 are each formed of a good conductor of electricity. Examples of the good conductor of electricity forming the first and second internal electrodes 12 and 13 include a metal containing as a main component nickel (Ni), copper (Cu), palladium (Pd), platinum (Pt), silver (Ag), gold (Au), or the like, and an alloy of those metals. Note that the main component is assumed as a component occupying 50% or more in the composition ratio.

As shown in FIG. 2, the first internal electrodes 12 are drawn to the first end surface 11a of the ceramic body 11 and connected to the first external electrode 14. The second internal electrodes 13 are drawn to the second end surface 11b of the ceramic body 11 and connected to the second external electrode 15. With this configuration, the first and second internal electrodes 12 and 13 are electrically conducted to the first and second external electrodes 14 and 15, respectively.

The ceramic layers 16 are formed of dielectric ceramics. In the multi-layer ceramic capacitor 10, in order to increase a capacitance of each ceramic layer 16 provided between the first internal electrode 12 and the second internal electrode 13, dielectric ceramics having a high dielectric constant is used. Examples of the dielectric ceramics having a high dielectric constant include a material having a Perovskite structure containing barium (Ba) and titanium (Ti), which is typified by barium titanate (BaTiO$_3$).

Additionally, the dielectric ceramics may be a strontium titanate (SrTiO$_3$) based material, a calcium titanate (CaTiO$_3$) based material, a magnesium titanate (MgTiO$_3$) based material, a calcium zirconate (CaZrO$_3$) based material, a calcium zirconate titanate (Ca(Zr,Ti)O$_3$) based material, a barium zirconate (BaZrO$_3$) based material, and a titanium oxide (TiO$_2$) based material, other than a barium titanate based material.

The covers 112 and the side margins 113 are also formed of dielectric ceramics. The material forming the covers 112 and the side margins 113 only needs to be insulating ceramics, but if a material having a composition system similar to that of the capacitance forming unit 111 is used therefor, production efficiency is increased, and internal stress in the ceramic body 11 is suppressed.

With the configuration described above, when a voltage is applied between the first and second external electrodes 14 and 15 in the multi-layer ceramic capacitor 10, the voltage is applied to the ceramic layers 16 provided between the first internal electrodes 12 and the second internal electrodes 13 in the capacitance forming unit 111. With this configuration, the multi-layer ceramic capacitor 10 stores charge corresponding to the voltage applied between the first and second external electrodes 14 and 15.

2. Configuration of External Electrode

As shown in FIG. 2, the first external electrode 14 covers the first end surface 11a and extends to at least the first main surface 11e. In this embodiment, the first external electrode 14 covers the first end surface 11a and extends to both the first and second main surfaces 11e and 11f and to both the side surfaces 11c and 11d. The second external electrode 15 covers the second end surface 11b and extends to at least the first main surface 11e. In this embodiment, the second external electrode 15 covers the second end surface 11b and extends to both the first and second main surfaces 11e and 11f and both the side surfaces 11c and 11d.

Each of the first and second external electrodes 14 and 15 includes a first region 17 and a second region 18. The first region 17 extends from the first end surface 11a or the second end surface 11b to the first main surface 11e. The second region 18 is disposed adjacent to the first region 17 in the Z-axis direction on each of the first and second end surfaces 11a and 11b. The description that "the second region 18 is disposed adjacent to the first region 17" includes the form in which the second region 18 is surrounded by the first region 17 as will be shown in an example to be described later.

In this embodiment, the second region 18 is disposed at the center portion of each of the first and second external electrodes 14 and 15 in the Z-axis direction. "The center portion of each of the first and second external electrodes 14 and 15 in the Z-axis direction" means a region at the center obtained when each of the first and second external electrodes 14 and 15 is divided equally into three in the Z-axis direction. The second region 18 is formed in a band-like (groove-like) shape extending along the Y-axis direction. The second region 18 only needs to be formed in at least a region on each of the first and second end surfaces 11a and 11b. In this embodiment, the second region 18 extends from a region on each of the first and second end surfaces 11a and 11b to regions on the side surfaces 11c and 11d.

In this embodiment, each of the first and second external electrodes 14 and 15 includes two first regions 17 disposed side by side in the Z-axis direction with the second region 18 being interposed therebetween. The two first regions 17 are completely disconnected by the second region 18, for example.

In this embodiment, those first regions 17 extend from the first end surface 11a or the second end surface 11b to the first main surface 11e and the second main surface 11f. More specifically, one of the first regions 17 extends from the center portion of the first external electrode 14 or the second external electrode 15 in the Z-axis direction to the first main surface 11e by passing through the first ridge 11g, and the other first region 17 extends from the center portion of the first external electrode 14 or the second external electrode 15 in the Z-axis direction to the second main surface 11f by passing through the second ridge 11h.

In this embodiment, the second region 18 is formed to be thinner than the first regions 17 and to be recessed from the first regions 17. As will be described later, the second region 18 is formed as a region for regulating the upward spreading of a solder.

Figure 4:
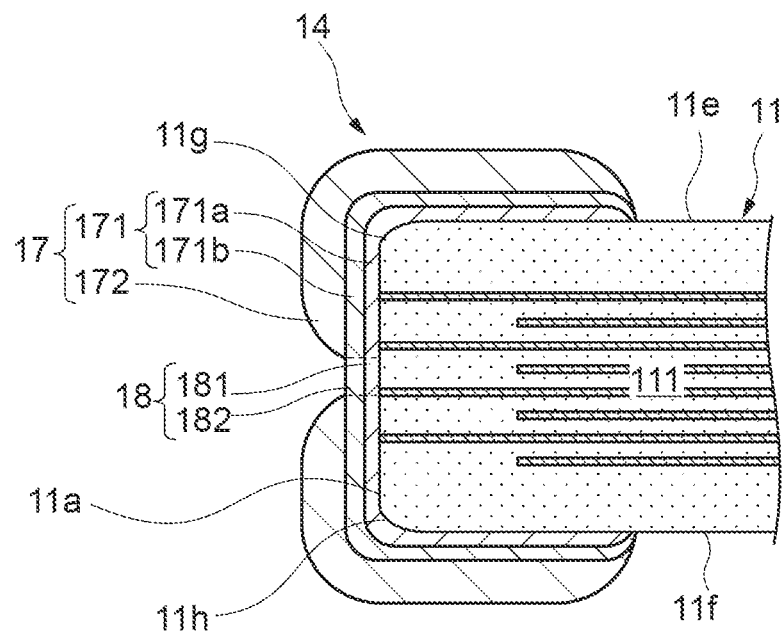
FIG. 4 is an enlarged view of a part of FIG. 2.

FIG. 4 is an enlarged view of a part of FIG. 2. Note that the configurations of the first and second external electrodes 14 and 15 are similar to each other, and thus illustration of the second external electrode 15 is omitted in FIG. 4.

In this embodiment, the first region 17 includes a first inner layer 171 and a first outermost layer 172. The first inner layer 171 is disposed on the ceramic body 11. The first outermost layer 172 contains tin as a main component and is disposed on the first inner layer 171.

The first inner layer 171 includes one or more layers, in this embodiment, a plurality of layers. The first inner layer 171 includes, for example, a first layer 171a disposed on the ceramic body 11, and a second layer 171b disposed on the first layer 171a. The first layer 171a includes one or more layers, for example, a plating base film and a plating film. The second layer 171b is the outermost layer of the first inner layer 171 and is formed of, for example, a plating film.

The plating base film of the first layer 171a is formed by, for example, application of an electrically conductive paste by a dip method, a printing method, or the like and baking. The plating base film may mainly contain copper, nickel, palladium, platinum, silver, gold, or the like.

The plating film of the first layer 171a may mainly contain copper, nickel, platinum, palladium, silver, gold, or the like other than tin, for example. Note that the plating film of the first layer 171a may be omitted.

The second layer 171b is a plating film mainly containing copper, nickel, platinum, palladium, silver, gold, or the like other than tin, for example. As an example, the second layer 171b is a nickel plating film mainly containing nickel.

In this embodiment, the first outermost layer 172 is formed as a tin plating film mainly containing tin. The first outermost layer 172 is disconnected into upper and lower portions at the center portion of the first external electrode 14 in the Z-axis direction.

In this embodiment, the second region 18 includes a second inner layer 181 disposed on the ceramic body 11, and a second outermost layer 182 disposed on the second inner layer 181. The second region 18 of this embodiment has a common layer structure with the first inner layer 171 of the first region 17.

The second inner layer 181 has a common layer structure with the first layer 171a of the first region 17, for example. In other words, the second inner layer 181 includes one or more layers, for example, a plating base film disposed on the ceramic body 11, and a plating film disposed on the plating base film. The plating base film is a layer continuous with the plating base film of the first layer 171*a*. The plating film is a layer continuous with the plating film of the first layer 171*a*. Note that the plating film of the second inner layer 181 may be omitted.

The second outermost layer 182 does not contain tin as a main component. Note that the description "a certain layer does not contain tin as a main component." means that the composition ratio of tin in the layer is 5% or less. The second outermost layer 182 mainly contains copper, nickel, platinum, palladium, silver, gold, or the like other than tin, for example. As an example, the second outermost layer 182 is a nickel plating film mainly containing nickel. In this embodiment, the second outermost layer 182 is formed continuously with at least a part of the first inner layer 171, specifically, continuously with the second layer 171*b* of the first inner layer 171. In other words, the second outermost layer 182 is a layer continuous with the second layer 171*b*.

Hereinafter, a production method for the multi-layer ceramic capacitor 10 having the above configuration will be described.

3. Production Method for Multi-layer Ceramic Capacitor

Figure 5:
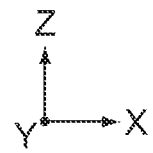
FIG. 5 is a flowchart showing a production method for the multi-layer ceramic electronic component.
Figure 5:
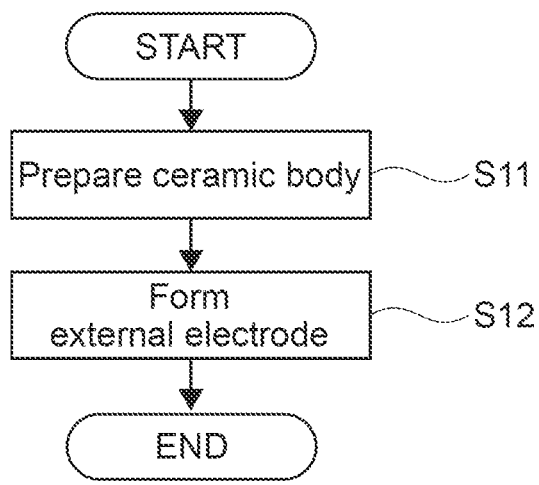
Figure 6:
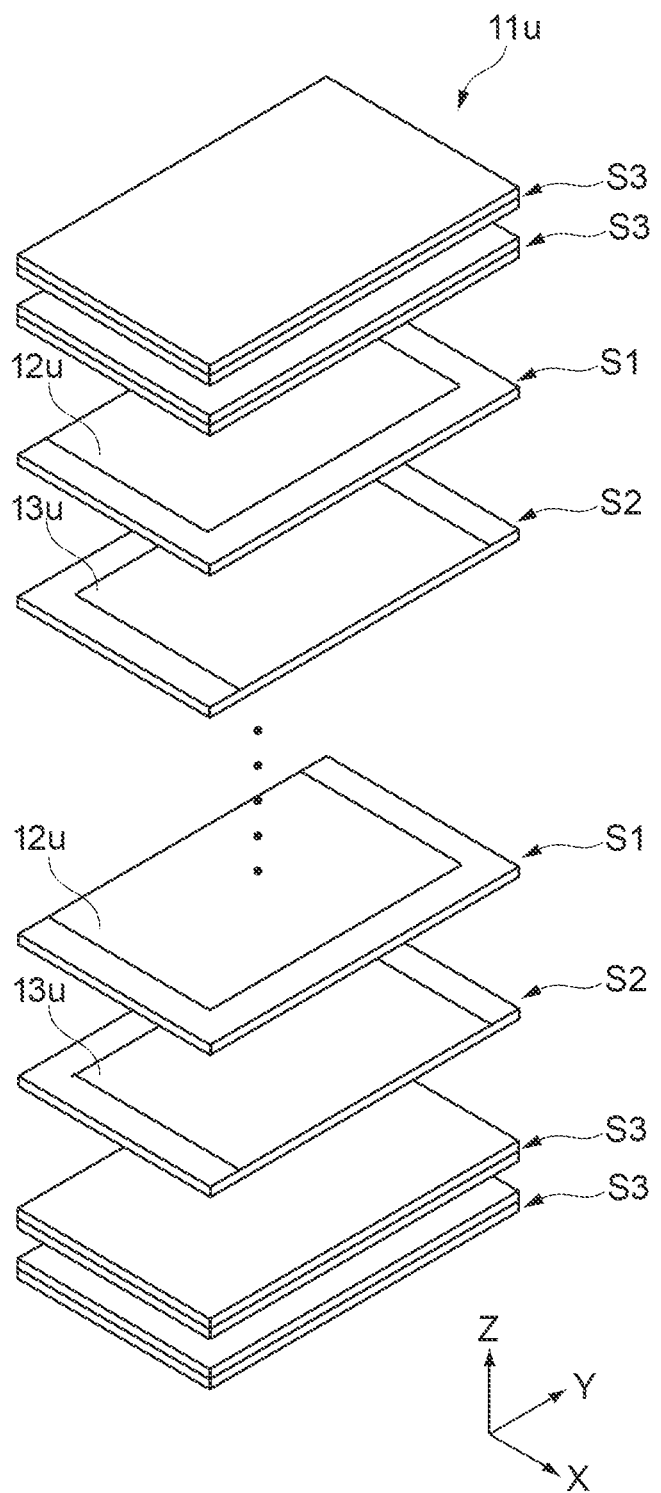
FIG. 6 is a perspective view showing a production process for the multi-layer ceramic electronic component.

FIG. 5 is a flowchart showing a production method for the multi-layer ceramic capacitor 10. FIG. 6 is a view showing a production process for the multi-layer ceramic capacitor 10. Hereinafter, the production method for the multi-layer ceramic capacitor 10 will be described according to FIG. 5 with reference to FIG. 6 as appropriate.

3.1 Step S11: Preparation of Ceramic Body

In Step S11, first ceramic sheets S1 and second ceramic sheets S2 for forming the capacitance forming unit 111, and third ceramic sheets S3 for forming the covers 112 are prepared. As shown in FIG. 6, the first, second, and third ceramic sheets S1, S2, and S3 are laminated and sintered to prepare the ceramic body 11.

The first, second, and third ceramic sheets S1, S2, and S3 are configured as unsintered dielectric green sheets mainly containing dielectric ceramics.

Unsintered first internal electrodes 12*u* corresponding to the first internal electrodes 12 are formed on the first ceramic sheets S1, and unsintered second internal electrodes 13*u* corresponding to the second internal electrodes 13 are formed on the second ceramic sheets S2. Each of the first and second ceramic sheets S1 and S2 includes a region, corresponding to the side margins 113 and including no internal electrode 12*u* or 13*u*, in the periphery of the internal electrode 12*u* or 13*u* in the Y-axis direction. No internal electrodes are formed on the third ceramic sheets S3.

In an unsintered ceramic body 11*u* shown in FIG. 6, the first and second ceramic sheets S1 and S2 are alternately laminated, and the third ceramic sheets S3 corresponding to the covers 112 are laminated on the upper and lower surfaces of the laminate of the first and second ceramic sheets S1 and S2 in the Z-axis direction. The unsintered ceramic body 11*u* is integrated by pressure-bonding the first, second, and third ceramic sheets S1, S2, and S3. Note that the number of first, second, and third ceramic sheets S1, S2, and S3 is not limited to the example shown in FIG. 6.

Note that while the unsintered ceramic body 11*u* corresponding to the single ceramic body 11 has been described above, in actually, a multi-layer sheet configured as a large-sized sheet, which is not singulated, is formed and then singulated into the ceramic bodies 11*u*.

The unsintered ceramic body 11*u* is sintered to produce the ceramic body 11 shown in FIGS. 1 to 3. The sintering temperature can be determined on the basis of the sintering temperature of the ceramic body 11*u*. For example, if a barium titanate based material is used as dielectric ceramics, the sintering temperature can be set to approximately 1000 to 1300° C. Additionally, sintering can be performed in a reduction atmosphere or a low-oxygen partial pressure atmosphere, for example.

3.2 Step S12: Formation of External Electrode

In Step S12, the first and second external electrodes 14 and 15 each including the first region 17 and the second region 18 are formed. In each of the first and second external electrodes 14 and 15 of this embodiment, a common layer of the first region 17 and the second region 18 is formed, and the first outermost layer 172 of the first region 17 is then formed.

First, a common plating base film of the first layer 171*a* of the first region 17 and the second inner layer 181 of the second region 18 is formed on each of the first and second end surfaces 11*a* and 11*b*. The plating base film is provided so as to extend from the first end surface 11*a* or the second end surface 11*b* to both the main surfaces 11*e* and 11*f* and both the side surfaces 11*c* and 11*d*, for example. The plating base film is formed by, for example, application of an electrically conductive paste by a dip method, a printing method, or the like and baking.

Subsequently, one or more plating films are formed over the entire plating base film. Each plating film mainly contains copper, nickel, platinum, palladium, silver, gold, or the like other than tin, and is formed by electroplating, for example. The outermost layer of the plating film is a layer constituting the second layer 171*b* of the first inner layer 171 of the first region 17 and the second outermost layer 182 of the second region 18 and is formed of a nickel plating film, for example.

A tin plating film mainly containing tin is then formed on the second layer 171*b* of the first region 17. The tin plating film is the first outermost layer 172. The tin plating film is formed by electroplating, for example. Before the tin plating film is formed, for example, treatment of preventing the tin plating film from being formed on the second outermost layer 182 of the second region 18 is performed. Thus, the tin plating film is formed on the second layer 171*b* of the first region 17.

The treatment of preventing the tin plating film from being formed may include, for example, oxidation treatment of forming a mask on the second layer 171*b* of the first region 17 and oxidizing the second outermost layer 182 of the second region 18. The oxidation treatment may be natural oxidation or plasma treatment in an oxygen atmosphere. The tin plating film is not formed on the second outermost layer 182 subjected to the oxidation treatment. Thus, after the oxidation treatment, the mask is removed and tin plating treatment is performed, and thus the tin plating film is formed onto the second layer 171*b* of the first region 17.

Alternatively, the treatment of preventing the tin plating film from being formed may include forming a mask on the second outermost layer 182 of the second region 18. The tin plating film is not formed in a region where the mask is formed. Thus, the tin plating treatment is performed after the mask is formed, so that the tin plating film is formed in a region corresponding to the first region 17. The mask can be removed after the tin plating film is formed.

Through the above steps, the multi-layer ceramic capacitor 10 shown in FIGS. 1 to 3 is produced.

Further, the multi-layer ceramic capacitor 10 is mounted on a board by soldering of the first and second external electrodes 14 and 15.

4. Configuration of Circuit Board

Figure 7:
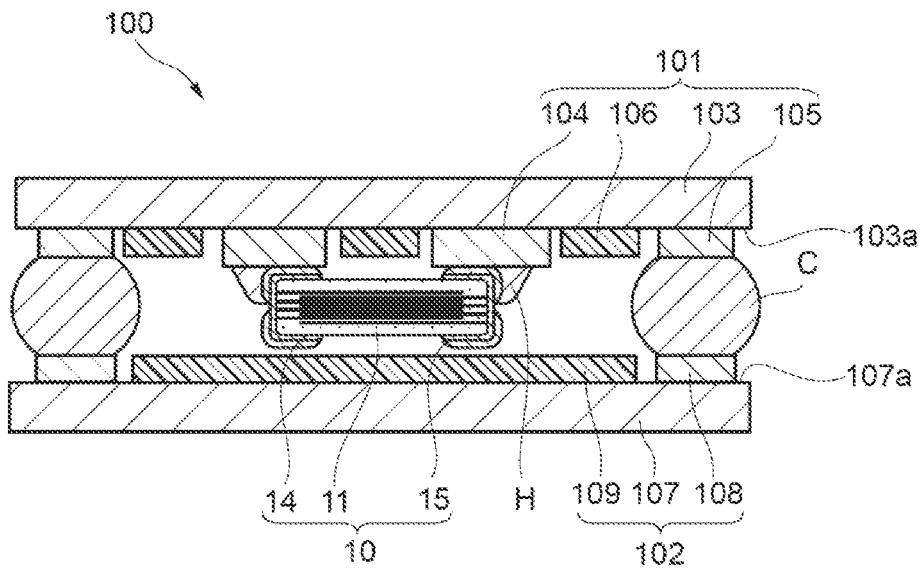
FIG. 7 is a schematic cross-sectional view of a circuit board mounting the multi-layer ceramic electronic component.
Figure 7:
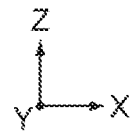

FIG. 7 is a view of a circuit board 100 of this embodiment and is a cross-sectional view corresponding to FIG. 2.

As shown in FIG. 7, the circuit board 100 includes a first board (mounting board) 101, the multi-layer ceramic capacitor 10, and a solder H that connects the first and second external electrodes 14 and 15 to the first board 101. Further, the circuit board 100 shown in FIG. 7 includes a second board 102 and a connection member C that connects the first board 101 and the second board 102 to each other.

The first board 101 is configured as a mounting board for mounting the multi-layer ceramic capacitor 10. The first board 101 includes a board body 103 having a mount surface 103a, a component mounting land 104 disposed on the mount surface 103a, a board connecting land 105 disposed on the mount surface 103a, and a solder resist 106 disposed around the component mounting land 104 and the board connecting land 105 on the mount surface 103a. A circuit (not shown) is formed on the board body 103. In this embodiment, the mount surface 103a is disposed so as to be orthogonal to the Z-axis direction. The component mounting land 104 and the board connecting land 105 are configured as connection terminals on the mount surface 103a. The solder resist 106 is configured as a resin coating with insulation properties.

The second board 102 is used as a board disposed to face the first board 101 in the Z-axis direction. The second board 102 includes a board body 107 having a counter surface 107a that faces the mount surface 103a, a board connecting land 108 disposed on the counter surface 107a, and a solder resist 109 disposed around the board connecting land 108 on the counter surface 107a. A circuit (not shown) is formed on the board body 107. In this embodiment, the counter surface 107a is disposed so as to face the mount surface 103a in the Z-axis direction, for example, disposed so as to be orthogonal to the Z-axis direction.

The board connecting land 108 is configured as a connection terminal on the counter surface 107a. The solder resist 109 is configured as a resin coating with insulation properties.

In this embodiment, the connection member C is configured as a ball-shaped solder. The connection member C connects the board connecting land 105 of the first board 101 and the board connecting land 108 of the second board 102 to each other and forms a gap between the mount surface 103a and the counter surface 107a in the Z-axis direction.

The circuit board 100 is produced as follows. First, a solder paste is applied to the component mounting land 104 on the first board 101, and the multi-layer ceramic capacitor 10 is disposed on the solder paste. Thus, the surfaces of the first and second external electrodes 14 and 15 on the main surface 11e are in contact with the solder paste. Note that the mount surface 103a of the first board 101 is typically disposed so as to face up in the vertical direction at the time of soldering.

Subsequently, a solder paste is applied to the board connecting land 105. The second board 102 is then disposed such that the solder paste on the board connecting land 105 comes into contact with the board connecting land 108 of the second board 102. Thus, the second board 102 is disposed to face the first board 101. The first board 101 and the second board 102 in this state are heated in a reflow furnace, and the solder pastes on the component mounting land 104 and the board connecting land 105 are heated and melted.

Along with the melt of the solder pastes, the multi-layer ceramic capacitor 10 sinks down toward the component mounting land 104. Thus, the solder paste on the component mounting land 104 spreads upward from the surfaces of the first and second external electrodes 14 and 15 on the first main surface 11e to the surfaces thereof on the first and second end surfaces 11a and 11b. The solder paste is cooled and solidified afterward, thus forming the solder H that connects the first and second external electrodes 14 and 15 to the first board 101. Similarly, the solder paste on the board connecting land 105 is melted and then solidified, thus forming the connection member C that connects the board connecting lands 105 and 108 of the first board 101 and the second board 102.

5. Operations and Effects of this Embodiment

In this embodiment, as shown in FIG. 4, the first region 17 disposed so as to cover the first ridge 11g includes the first outermost layer 172 mainly containing tin. At the time of mounting, the solder paste spreads upward on the first outermost layer 172 from the first ridge 11g toward the second ridge 11h. Since the first outermost layer 172 mainly contains tin and thus reacts with the solder paste to be melted, and is then satisfactorily bonded to the then solder H when the solder H is solidified. Therefore, the first region 17 including the first outermost layer 172 is capable of satisfactorily ensuring the reliability of bonding to the solder H.

Meanwhile, the first and second external electrodes 14 and 15 in this embodiment include the second regions 18 disposed adjacent to the first regions 17 in the Z-axis direction on the first and second end surfaces 11a and 11b. The second region 18 does not include an outermost layer mainly containing tin and is suppressed from reacting with the solder H. Thus, in the second region 18, the solder paste can be suppressed from spreading upward and prevented from reaching the second ridge 11h. Therefore, the solder H can be prevented from being formed in regions of the first and second external electrodes 14 and 15 on the second main surface 11f after the mounting.

Figure 8:
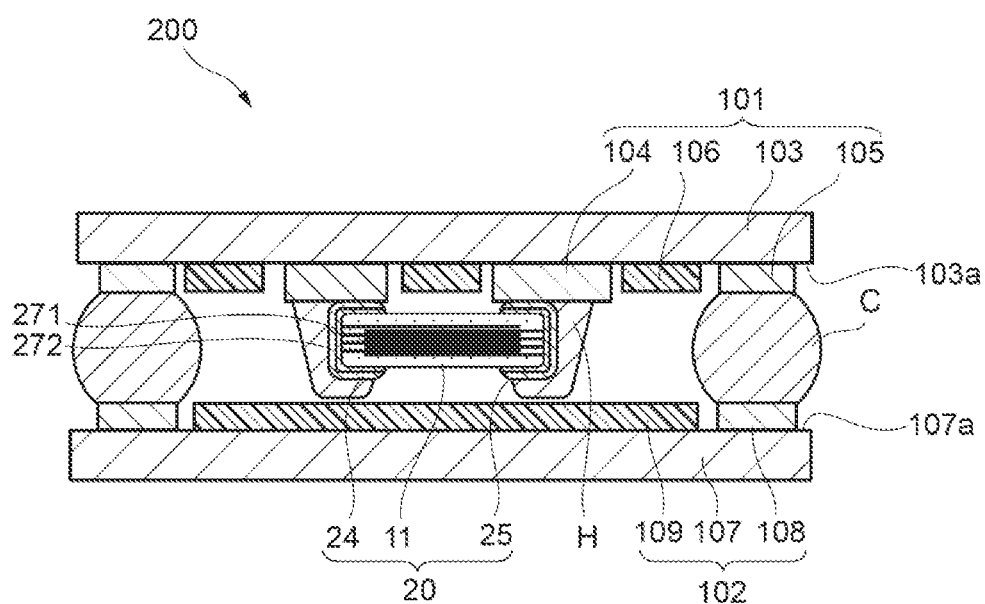
FIG. 8 is a schematic cross-sectional view of a circuit board mounting a multi-layer ceramic electronic component according to a comparative example of the first embodiment.
Figure 8:
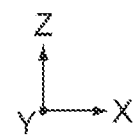

FIG. 8 is a schematic cross-sectional view of a circuit board 200 on which a multi-layer ceramic capacitor 20 according to a comparative example of this embodiment is mounted.

As shown in FIG. 8, the multi-layer ceramic capacitor 20 includes external electrodes 24 and 25 without second regions. In other words, each of the external electrodes 24 and 25 is configured similar to the first region 17 of this embodiment as a whole and includes a first outermost layer 272 mainly containing tin and a first inner layer 271.

Figure 9:
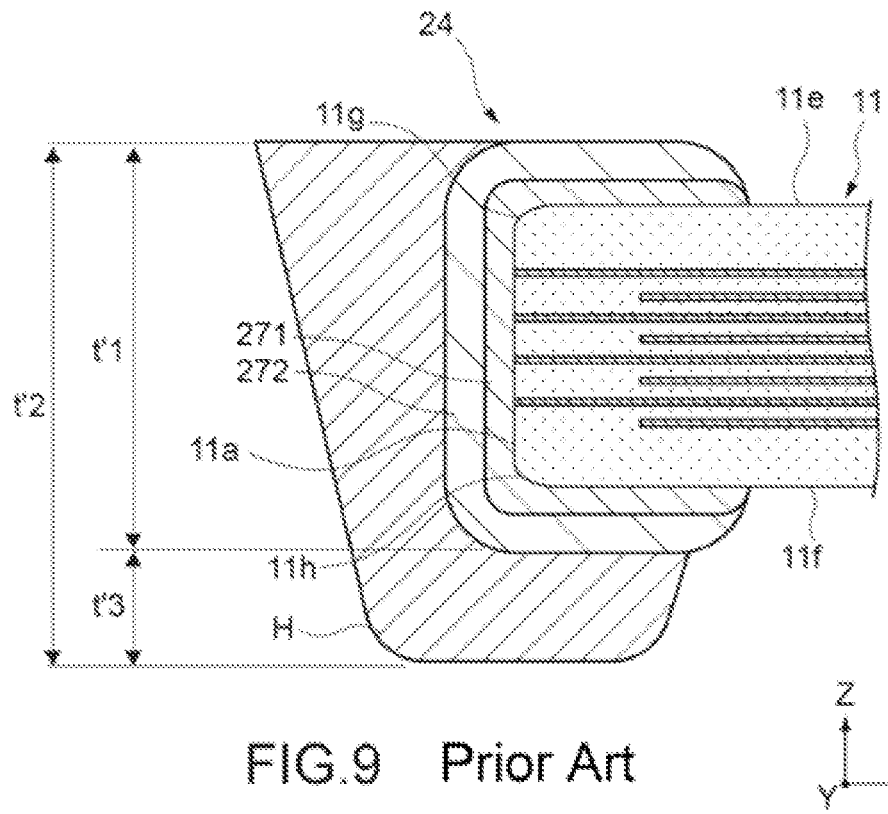
FIG. 9 is an enlarged view of a part of FIG. 8.

FIG. 9 is an enlarged view of a part of FIG. 8.

In the multi-layer ceramic capacitor 20, at the time of mounting, a solder paste spreads upward from the first ridge 11g toward the second ridge 11h and may reach the surfaces of the external electrodes 24 and 25 on the second main surface 11f. In particular, in a case where the multi-layer ceramic capacitor 20 has a low height, the height dimension thereof in the Z-axis direction is small, and thus the solder paste easily reaches the surfaces of the external electrodes 24 and 25 on the second main surface 11f.

As shown in FIG. 9, the height dimension of the multi-layer ceramic capacitor 20 in the Z-axis direction is represented as a component height dimension t'1. The height dimension of the solder H in the Z-axis direction is represented as a solder height dimension t'2. In this example, the solder H is formed on the surfaces of the external electrodes 24 and 25 on the second main surface 11f, and thus the solder height dimension t'2 is larger than the component height dimension t'1 by a thickness t'3 in the Z-axis direction. As a result, the substantive height dimension of the multi-layer ceramic capacitor 20 mounted through the solder H is the solder height dimension t'2, which is larger than the real component height dimension t'1 by the thickness t'3.

For that reason, in the circuit board 200, it is necessary to set the opposing distance between the first board 101 and the second board 102 in consideration of the solder height dimension t'2 larger than the component height dimension t'1. This may make it difficult to reduce the thickness of the entire circuit board 200 and may hinder the miniaturization of an electronic device in which the circuit board 200 is to be mounted.

Additionally, the solder H on the surfaces of the external electrodes 24 and 25 on the second main surface 11f is prone to come into contact with a structure such as the solder resist 109 of the second board 102. As a result, an external shock may be applied to the multi-layer ceramic capacitor 20 to cause damages such as cracks.

Further, in a case where the opposing distance between the first board 101 and the second board 102 is defined, it is necessary to set the solder height dimension t'2 of the multi-layer ceramic capacitor 20 to be equal to or smaller than the opposing distance. Thus, it is necessary to set the component height dimension t'1 to be small by the thickness t'3 of the solder H. This inevitably restricts the height dimension of the ceramic body 11, limits the number of first and second internal electrodes 12 and 13 to be laminated of the multi-layer ceramic capacitor 20, and makes it difficult to increase the capacitance. The thickness of each ceramic layer 16 is also reduced accordingly, and problems such as deterioration of bias characteristics and deterioration of reliability may also occur.

On the other hand, in the multi-layer ceramic capacitor 10 of this embodiment, the first and second external electrodes 14 and 15 each include the second region 18 that regulates the upward spreading of the solder H. This can suppress the solder H from reaching the surfaces of the first and second external electrodes 14 and 15 on the second main surface 11f.

Figure 10:
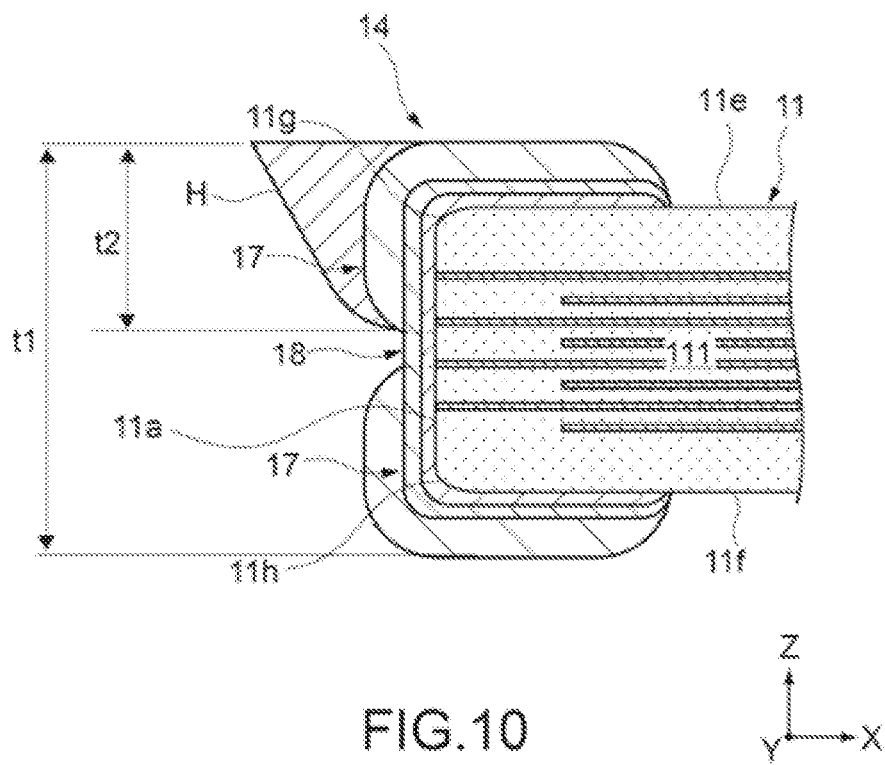
FIG. 10 is an enlarged view of a part of FIG. 7.

FIG. 10 is an enlarged view of a part of FIG. 7.

As shown in FIG. 10, the height dimension of the multi-layer ceramic capacitor 10 in the Z-axis direction is represented as a component height dimension t1. The height dimension of the solder H in the Z-axis direction is represented as a solder height dimension t2. In this embodiment, the solder H does not reach the surfaces of the first and second external electrodes 14 and 15 on the second main surface 11f by the operation of the second region 18 to suppress the solder from spreading upward. As a result, the solder height dimension t2 is smaller than the component height dimension t1. In other words, even when the mounting is performed through the solder H, the substantive height dimension of the multi-layer ceramic capacitor 10 coincides with the real component height dimension t1.

Thus, in the circuit board 100, the opposing distance between the first board 101 and the second board 102 can be set merely in consideration of the component height dimension t1. This makes it possible to reduce the thickness of the circuit board 100 in the Z-axis direction and to contribute to the miniaturization of an electronic device in which the circuit board 100 is to be mounted.

Additionally, in the circuit board 100, there is no solder H that increases the substantive height dimension of the multi-layer ceramic capacitor 10. As a result, even when the opposing distance between the first board 101 and the second board 102 is narrowed, the multi-layer ceramic capacitor 10 can be suppressed from coming into contact with a structure of the second board 102, and the multi-layer ceramic capacitor 10 can be prevented from being damaged.

Further, even when the opposing distance between the first board 101 and the second board 102 is defined, the component height dimension t1 of the multi-layer ceramic capacitor 10 can be satisfactorily ensured in accordance with the opposing distance without considering the thickness t'3 of the solder H. This makes it possible to satisfactorily ensure the height dimension of the ceramic body 11 of the multi-layer ceramic capacitor 10. Therefore, the number of the first and second internal electrodes 12 and 13 to be laminated can be increased, and the increase in capacitance can be achieved. Additionally, the deterioration of bias characteristics and the deterioration of reliability resulting from the reduction in thickness of the ceramic layers 16 can also be suppressed.

Further, since the component height dimension t1 of the multi-layer ceramic capacitor 10 can be satisfactorily ensured, the flexural strength of the multi-layer ceramic capacitor 10 can be satisfactorily ensured. The flexural strength of the multi-layer ceramic capacitor is a strength measured as follows: both end portions of the multi-layer ceramic capacitor 10 in the X-axis direction or in the Y-axis direction are supported in the Z-axis direction using a base or the like, and the center portion of the multi-layer ceramic capacitor 10 on the X-Y plane is pressed downward in the Z-axis direction by using a pusher. The value of the flexural strength can be a value of the magnitude of the load applied to the pusher when the multi-layer ceramic capacitor is damaged. Actually, when the opposing distance between the first board 101 and the second board 102 in each of the circuit boards 100 and 200 was set to be the same, the flexural strength of the multi-layer ceramic capacitor 10 of this embodiment increased to approximately 1.4 times the flexural strength of the multi-layer ceramic capacitor 20 according to the comparative example.

In other words, in the multi-layer ceramic capacitor 10, the mechanical strength can be increased even if the height is low. Therefore, it is possible to obtain a highly reliable configuration against the flexure of the board, an external shock, and the like after mounting.

Additionally, in this embodiment, the second region 18 is configured to extend in the Y-axis direction. Thus, the second region 18 can come into contact with the solder spreading upward in the Z-axis direction in a wide range in the regions of the first and second external electrodes 14 and 15 on the first and second end surfaces 11a and 11b, and the solder can be more effectively suppressed from spreading upward. Further, since the first regions 17 are completely disconnected by the second region 18, the solder can be more reliably suppressed from spreading upward in the Z-axis direction.

In addition, in this embodiment, the second region 18 is disposed at the center portion of each of the first and second external electrodes 14 and 15 in the Z-axis direction, and the first regions 17 extend from the first end surface 11a or the second end surface 11b to both the main surfaces 11e and 11f. As a result, the above-mentioned operations and effects can be obtained in any of the case of mounting with the first main surface 11e facing the first board 101 and the case of mounting with the second main surface 11f facing the first board 101. This makes it possible to enhance the degree of freedom in mounting posture of the multi-layer ceramic capacitor 10 and to enhance the handling property at the time of mounting.

6. Modified Example

The layers of the first regions 17 and the second region 18 may take various configurations besides the example described above.

For example, the second inner layer 181 of the second region 18 may be configured by a layer continuous with the plating base film included in the first layer 171a of the first region 17, and the second outermost layer 182 may be configured by a layer continuous with the plating film included in the first layer 171a of the first region 17.

Figure 11:
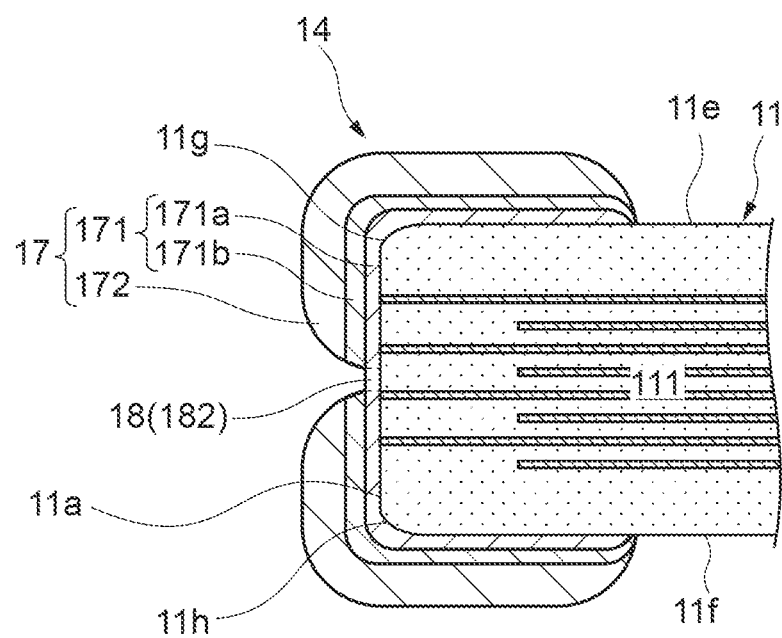
FIG. 11 is an enlarged cross-sectional view showing a modified example of the multi-layer ceramic electronic component and corresponding to FIG. 7.
Figure 11:
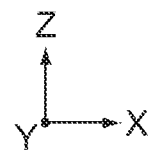

Alternatively, as shown in FIG. 11, the second region 18 may include the second outermost layer 182 and include no second inner layer. For example, the second outermost layer 182 may be a baked film of an electrically conductive paste configured as the plating base film and may be formed continuously with the plating base film of the first layer 171a of the first region 17. In this case, in the first region 17, the first layer 171a of the first inner layer 171 may be configured as the plating base film, and the second layer 171b may be configured as one or more plating films that do not contain tin as a main component.

II Second Embodiment

1. Configuration of Multi-layer Ceramic Capacitor

Figure 12:
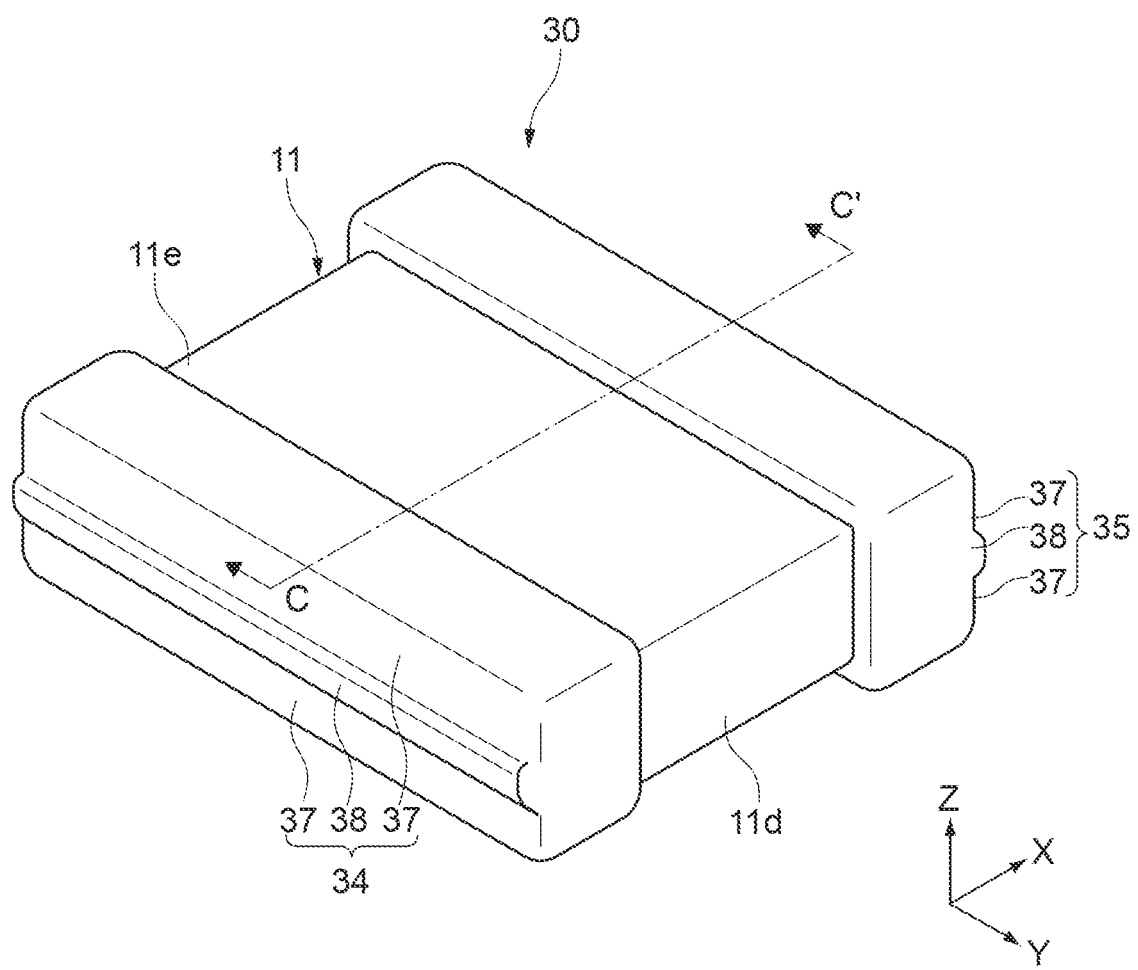
FIG. 12 is a perspective view of a multi-layer ceramic electronic component according to a second embodiment of the present disclosure.
Figure 13:
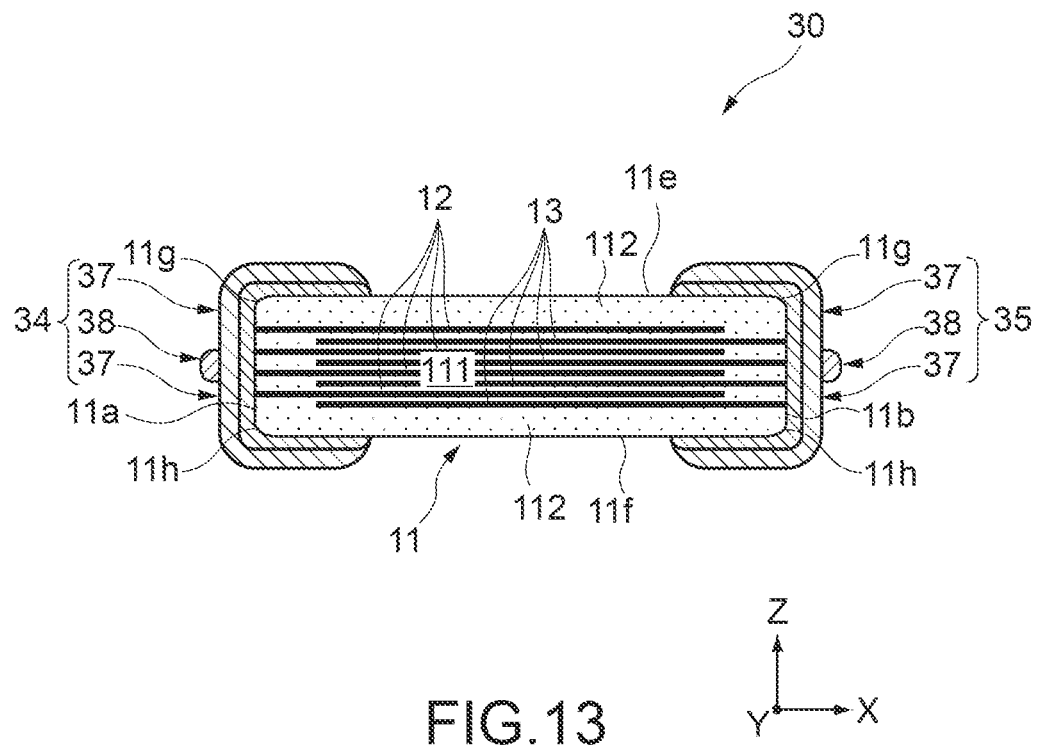
FIG. 13 is a cross-sectional view taken along the line C-C' in FIG. 12.

FIG. 12 is a perspective view of a multi-layer ceramic capacitor 30 according to a second embodiment of the present disclosure. FIG. 13 is a cross-sectional view of the multi-layer ceramic capacitor 30 taken along the line C-C' in FIG. 12. Note that the cross-section taken parallel to the Y-Z plane corresponding to FIG. 3 is similar to that of the first embodiment, and thus illustration thereof will be omitted.

Additionally, in the following description, the configurations similar to those of the first embodiment described above will be denoted by the same reference symbols, and description thereof will be omitted.

The multi-layer ceramic capacitor 30 includes a ceramic body 11, a first external electrode 34, and a second external electrode 35. In this embodiment, the first external electrode 34 covers the first end surface 11a and extends to both the main surfaces 11e and 11f and both the side surfaces 11c and 11d. In this embodiment, the second external electrode 35 covers the second end surface 11b and extends to both the main surfaces 11e and 11f and both the side surfaces 11c and 11d.

Each of the first and second external electrodes 34 and 35 includes a first region 37 and a second region 38. The first region 37 covers a first ridge 11g and a second ridge 11h. The second region 18 is disposed adjacent to the first region 37 in the Z-axis direction.

In this embodiment, the second region 38 is disposed at the center portion of each of the first and second external electrodes 34 and 35 in the Z-axis direction. The second region 38 is formed in a band-like shape extending along the Y-axis direction. The second region 38 is formed, for example, in a region on each of the first and second end surfaces 11a and 11b. In this embodiment, the second region 38 has a configuration protruding from the first region 37.

The first region 37 extends from the first and second end surfaces 11a and 11b to regions on both the main surfaces 11e and 11f and both the side surfaces 11c and 11d. In this embodiment, the first region 37 is disconnected into upper and lower portions in the Z-axis direction by the second region 38 in the region on each of the first and second end surfaces 11a and 11b. The first region 37 cover both the first ridge 11g and the second ridge 11h.

Figure 14:
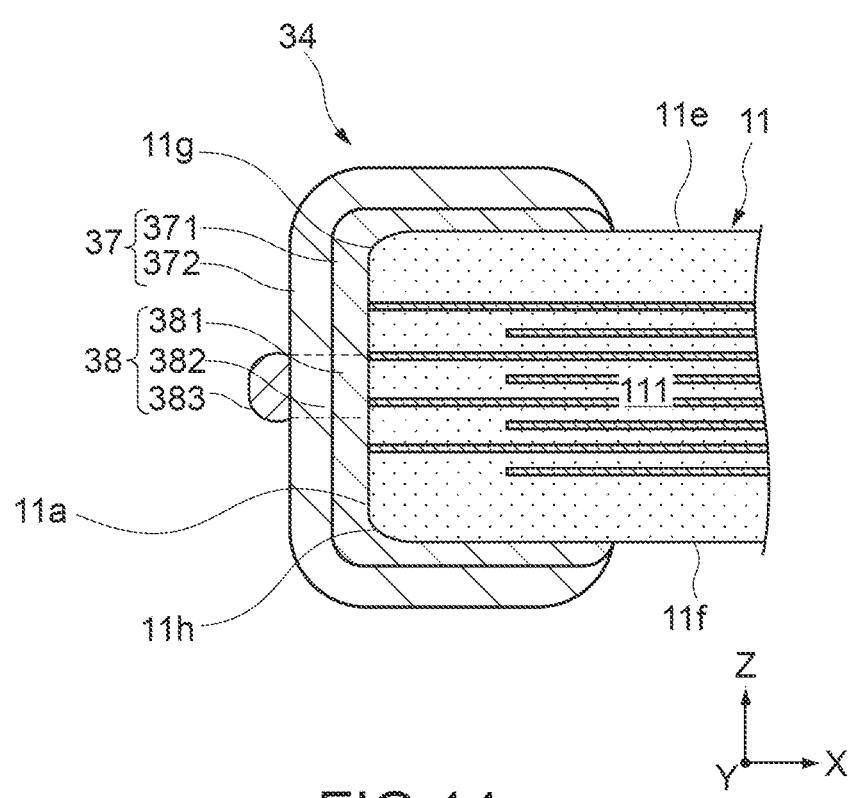
FIG. 14 is an enlarged view of a part of FIG. 13.

FIG. 14 is an enlarged view of a part of FIG. 13. Note that the configurations of the first and second external electrodes 34 and 35 are similar to each other, and thus the illustration of the second external electrode 35 is omitted in FIG. 14.

In this embodiment, the first region 37 includes a first inner layer 371 and a first outermost layer 372 mainly contains tin.

The first inner layer 371 is disposed on the ceramic body 11. The first inner layer 371 includes one or more layers, in this embodiment, a plurality of layers. The first inner layer 371 includes a plating base film and one or more plating films, like the first inner layer 171 of the first embodiment.

The first outermost layer 372 is disposed on the first inner layer 371. The first outermost layer 372 is formed as a tin plating film mainly containing tin, like the first outermost layer 172 of the first embodiment.

In this embodiment, the second region 38 includes a second inner layer 381, a tin-containing layer 382, and a second outermost layer 383 that does not contain tin as a main component.

The second inner layer 381 is disposed on the ceramic body 11 and has a common layer structure with the first inner layer 371 of the first region 37. In other words, the second inner layer 381 includes one or more layers, for example, a plating base film and one or more plating films.

The tin-containing layer 382 mainly contains tin and is disposed on the second inner layer 381. The tin-containing layer 382 is formed continuously with the first outermost layer 372 and configured as a tin plating film mainly containing tin.

The second outermost layer 383 does not contain tin, which is highly reactive with a solder, as a main component. Thus, the second region 38 is configured as a region for regulating the upward spreading of the solder. The composition of the second outermost layer 383 is not particularly limited as long as the second outermost layer 383 contains a main component other than tin. For example, the second outermost layer 383 may mainly contain a metal such as gold or platinum other than tin, a metal oxide such as a copper oxide, ceramics, or diamond-like carbon.

The method of forming the second outermost layer 383 is not particularly limited, and a method such as a sputtering method, a vapor-deposition method, or a print method is appropriately selected depending on its composition. The second outermost layer 383 is formed by the above-mentioned method after a mask is formed on the first outermost layer 372 of the first region 37, for example. The mask is removed after the second outermost layer 383 is formed, for example.

2. Configuration of Circuit Board

Figure 15:
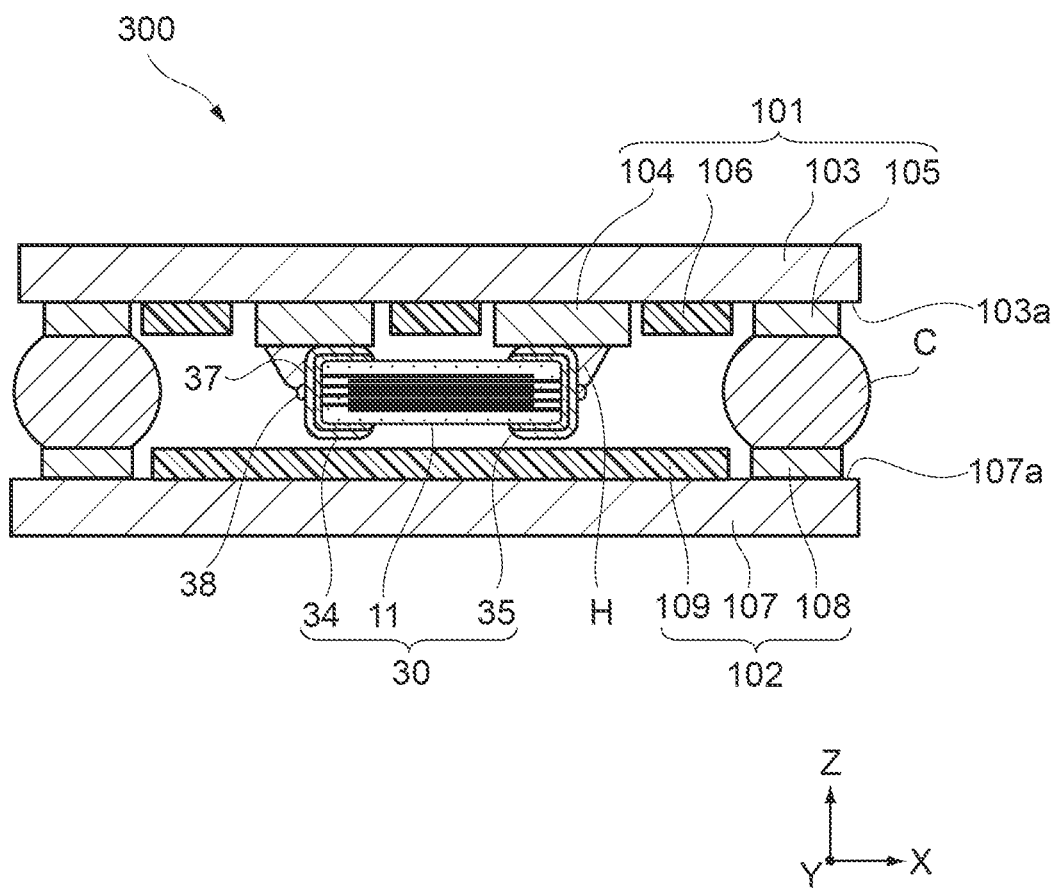
FIG. 15 is a schematic cross-sectional view of a circuit board mounting the multi-layer ceramic electronic component.

FIG. 15 is a view of a circuit board 300 of this embodiment and is a cross-sectional view corresponding to FIG. 13.

As shown in FIG. 15, the circuit board 300 includes a first board (mounting board) 101, the multi-layer ceramic capacitor 30, and a solder H that connects the first and second external electrodes 34 and 35 to the first board 101. Further, the circuit board 300 shown in FIG. 15 includes a second board 102 and a connection member C that connects the first board 101 and the second board 102 to each other. The solder H is formed to reach the second region 38 from the first region 37 of each of the first and second external electrodes 34 and 35 of the multi-layer ceramic capacitor 30.

3. Operations and Effects of this Embodiment

Also in this embodiment, because of the second regions 38 of the first and second external electrodes 34 and 35, the upward spreading of the solder on the first and second external electrodes 34 and 35 is regulated. Thus, the solder height dimension can be reduced, and the substantive height dimension of the multi-layer ceramic capacitor 30 in the circuit board 300 can be regulated. This makes it possible to reduce a mounting space of the multi-layer ceramic capacitor 30 and to contribute to the miniaturization of the circuit board 300 and an electronic device in which the circuit board 300 is to be mounted. Additionally, since the substantive height dimension of the multi-layer ceramic capacitor 30 can be regulated, the multi-layer ceramic capacitor 30 can be suppressed from coming into contact with another structure in the circuit board 300 and can be prevented from being damaged. Further, the height dimension of the ceramic body 11 can be satisfactorily ensured, which makes it possible to contribute to the increase in capacitance of the multi-layer ceramic capacitor 30 and the improvement in bias characteristics and to satisfactorily ensure the mechanical strength of the multi-layer ceramic capacitor 30.

In addition, since the second region 38 is configured to extend in the Y-axis direction, it is possible to effectively suppress the solder from spreading upward in the Z-axis direction. Additionally, since the second region 38 is disposed at the center portion of each of the first and second external electrodes 34 and 35 in the Z-axis direction, and the first region 37 extends to both the main surfaces 11e and 11f, the degree of freedom in mounting posture of the multi-layer ceramic capacitor 30 can be enhanced.

III Third Embodiment

1. Configuration of Multi-layer Ceramic Capacitor

Figure 16:
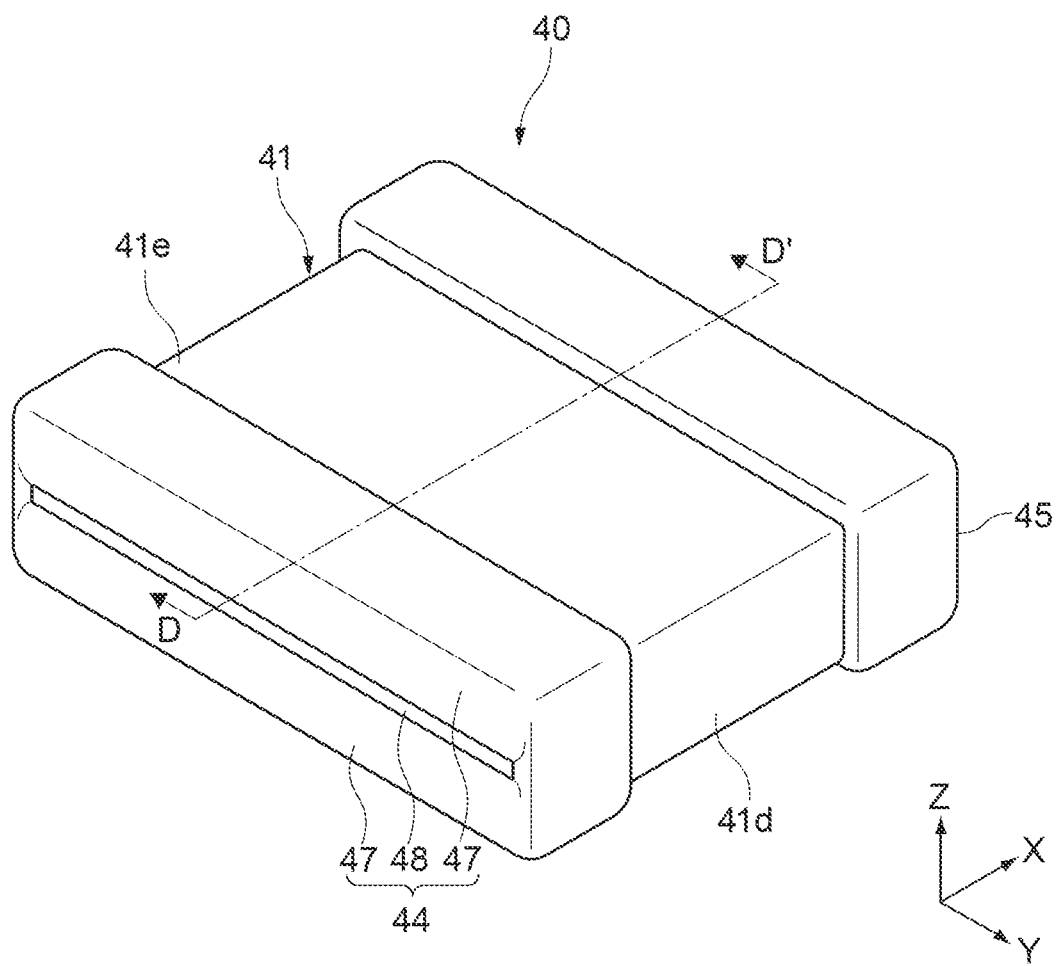
FIG. 16 is a perspective view of a multi-layer ceramic electronic component according to a third embodiment of the present disclosure.
Figure 17:
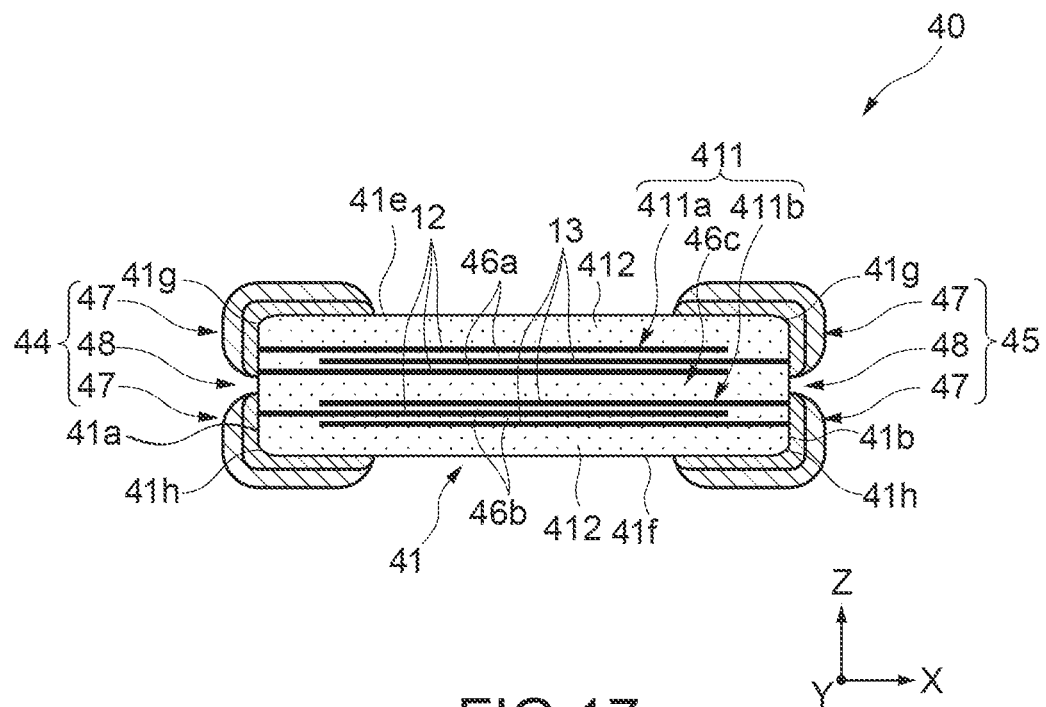
FIG. 17 is a cross-sectional view taken along the line D-D' in FIG. 16.

FIG. 16 is a perspective view of a multi-layer ceramic capacitor 40 according to a third embodiment of the present disclosure. FIG. 17 is a cross-sectional view of the multi-layer ceramic capacitor 40 taken along the line D-D' in FIG. 16.

The multi-layer ceramic capacitor 40 includes a ceramic body 41, a first external electrode 44, and a second external electrode 45. In this embodiment, the first external electrode 44 covers a first end surface 41a and extends to both main surfaces 41e and 41f and both side surfaces 41c and 41d. In this embodiment, the second external electrode 45 covers a second end surface 41b and extends to both the main surfaces 41e and 41f and both the side surfaces 41c and 41d.

The ceramic body 41 includes a capacitance forming unit 411, covers 412, and side margins (not shown). The covers 412 are disposed on both sides of the capacitance forming unit 411 in the Z-axis direction. The side margins are disposed on both sides of the capacitance forming unit 411 in the Y-axis direction.

The capacitance forming unit 411 includes a first capacitance forming region 411a, a second capacitance forming region 411b, and an intermediate ceramic layer 46c. The first capacitance forming region 411a includes first internal electrodes 12 and second internal electrodes 13 alternately laminated in the Z-axis direction via first ceramic layers 46a. The second capacitance forming region 411b includes first internal electrodes 12 and second internal electrodes 13 alternately laminated in the Z-axis direction via second ceramic layers 46b. The second capacitance forming region 411b is connected to the first capacitance forming region 411a in the Z-axis direction via the intermediate ceramic layer 46c. The intermediate ceramic layer 46c is configured to have a larger thickness dimension in the Z-axis direction than the first ceramic layers 46a and the second ceramic layers 46b.

Each of the first and second external electrodes 44 and 45 includes a first region 47 and a second region 48. The first region 47 covers ridges 41g and 41h. The second region 48 is disposed adjacent to the first region 47 in the Z-axis direction. In this embodiment, the second region 48 does not include an electrically conductive layer constituting an electrode.

In this embodiment, the second region 48 is disposed at the center portion of each of the first and second external electrodes 44 and 45 in the Z-axis direction, for example, disposed in the circumference of the intermediate ceramic layer 46c. The second region 48 is formed in a band-like (groove-like) shape extending along the Y-axis direction. The second region 48 is formed in a region on each of the first and second end surfaces 41a and 41b, for example.

The first region 47 extends from a region on each of the first and second end surfaces 41a and 41b to regions on both the main surfaces 41e and 41f and both the side surfaces 41c and 41d. In this embodiment, the first region 47 is disconnected into upper and lower portions in the Z-axis direction by the second region 48 in the region on each of the first and second end surfaces 41a and 41b.

Figure 18:
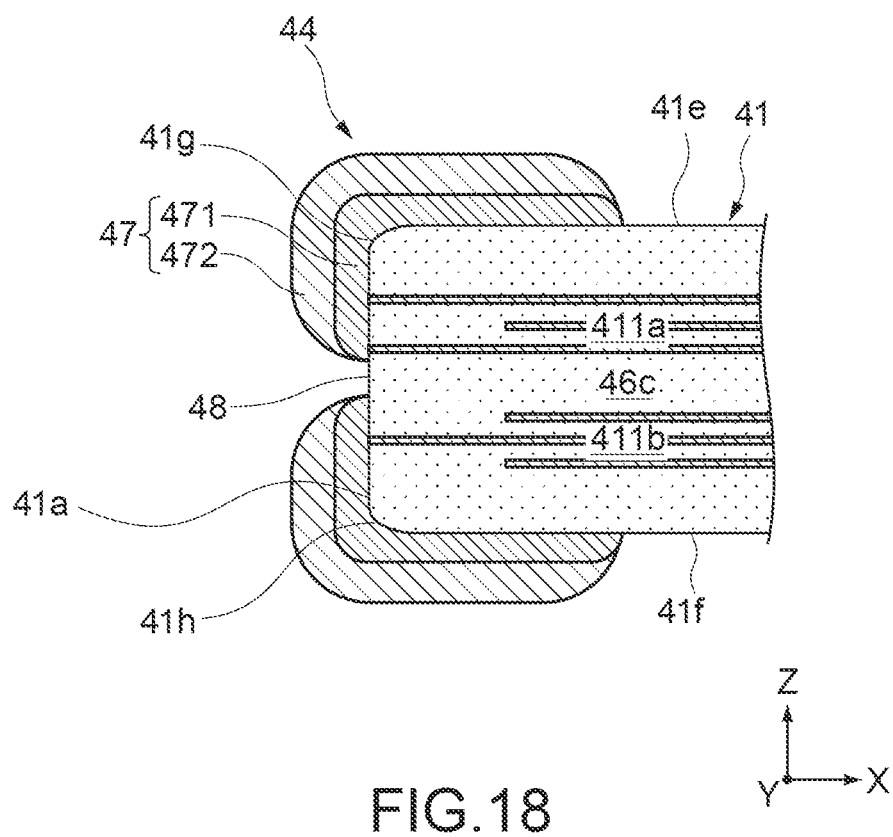
FIG. 18 is an enlarged view of a part of FIG. 17.

FIG. 18 is an enlarged view of a part of FIG. 17. Note that the configurations of the first and second external electrodes 44 and 45 are similar to each other, and thus the illustration of the second external electrode 45 is omitted in FIG. 18.

In this embodiment, the first region 47 includes a first inner layer 471 and a first outermost layer 472.

The first inner layer 471 is disposed on the ceramic body 41. The first inner layer 471 includes one or more layers. In this embodiment, the first inner layer 471 includes a plating base film and one or more plating films, like the first inner layer 171 of the first embodiment.

The first outermost layer 472 mainly contains tin and is disposed on the first inner layer 471. The first outermost layer 472 is configured as a tin plating film mainly containing tin, like the first outermost layer 172 of the first embodiment.

The second region 48 does not include an outermost layer mainly containing tin, and in this embodiment, does not include an electrode layer. In other words, each of the first and second end surfaces 41a and 41b of the ceramic body 41 is exposed from the second region 48 in this embodiment. Thus, the second region 48 is configured as a region that is less reactive with a solder and regulates the upward spreading of the solder.

2. Production Method for Multi-layer Ceramic Capacitor

Figure 19:
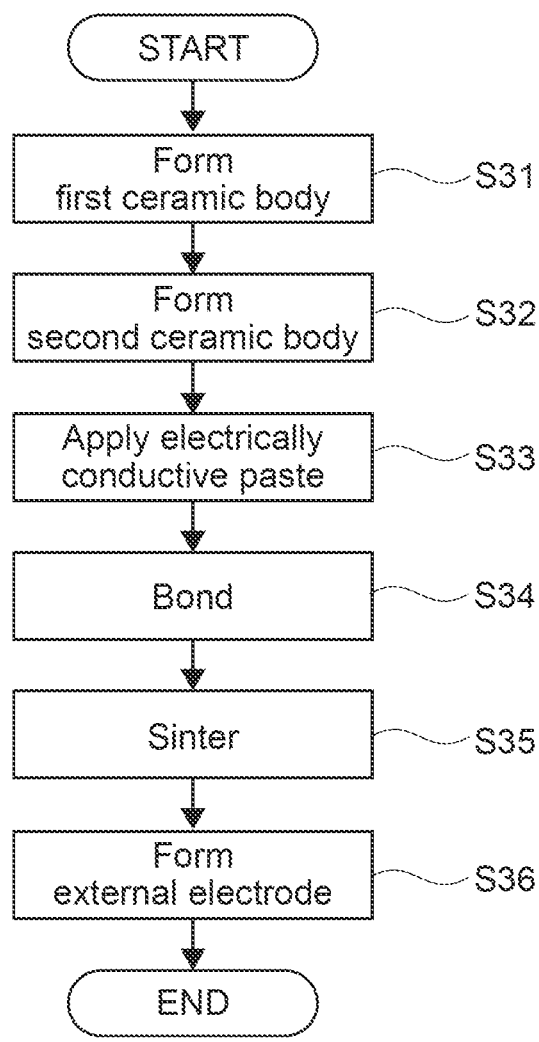
FIG. 19 is a flowchart showing an example of a production method for the multi-layer ceramic electronic component.
Figure 20A:
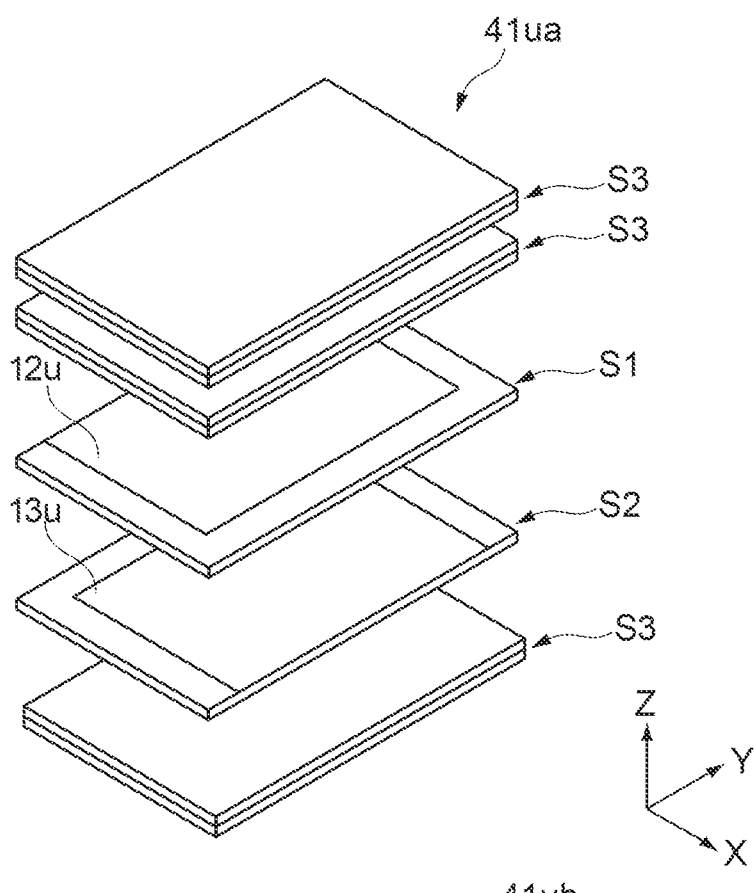
FIGS. 20A and 20B are perspective views showing a production process for the multi-layer ceramic electronic component.
Figure 20B:
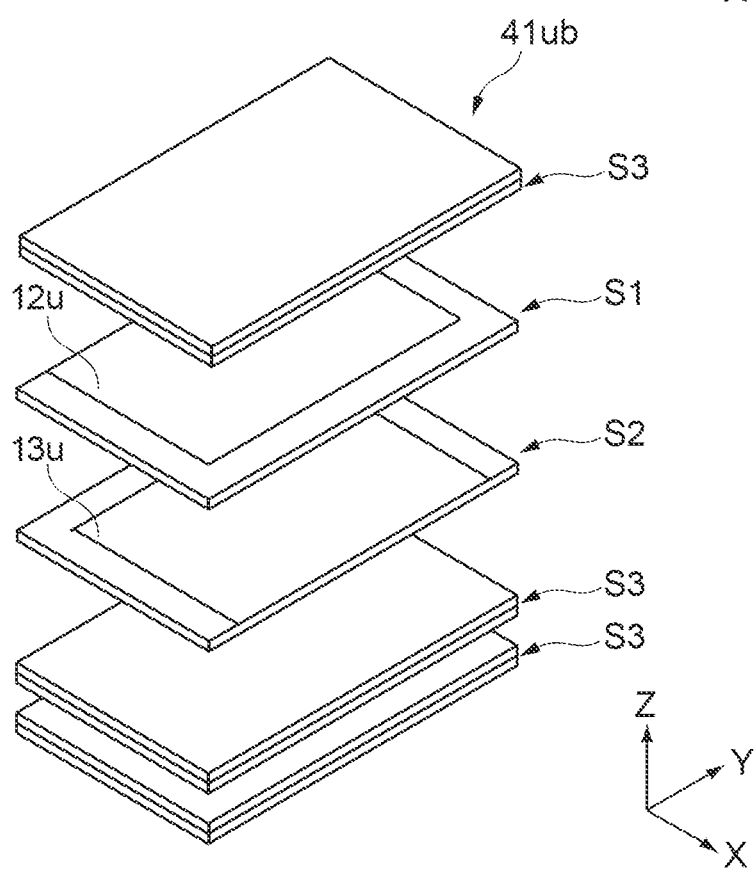

FIG. 19 is a flowchart showing an example of a production method for the multi-layer ceramic capacitor 40. FIGS. 20A and 20B are views showing a production process for the multi-layer ceramic capacitor 40. Hereinafter, the production method for the multi-layer ceramic capacitor 40 will be described according to FIG. 19 with reference to FIGS. 20A and 20B as appropriate.

2.1 Step S31: Preparation of First Ceramic Body

In Step S31, first ceramic sheets S1 and second ceramic sheets S2 for forming the first capacitance forming region 411a, and third ceramic sheets S3 for forming the cover 412 and a part of the intermediate ceramic layer 46c are prepared. As shown in FIG. 20A, the first, second, and third ceramic sheets S1, S2, and S3 are laminated to prepare an unsintered first ceramic body 41ua. The first, second, and third ceramic sheets S1, S2, and S3 have the configuration similar to that of the first embodiment. Note that the number of first, second, and third ceramic sheets S1, S2, and S3 is not limited to the example shown in FIG. 20A.

In the unsintered first ceramic body 41ua shown in FIG. 20A, the laminate in which the first and second ceramic sheets S1 and S2 are alternately laminated is formed, and the third ceramic sheets S3 corresponding to the cover 412 close to the main surface 41e are laminated on the upper surface of the laminate in the Z-axis direction. The third ceramic sheet S3 constituting a part of the intermediate ceramic layer 46c is disposed on the lower surface of the laminate in the Z-axis direction. The unsintered first ceramic body 41ua is integrated by pressure-bonding the first, second, and third ceramic sheets S1, S2, and S3.

2.2 Step S32: Preparation of Second Ceramic Body.

In Step S32, first ceramic sheets S1 and second ceramic sheets S2 for forming the second capacitance forming region 411b, and third ceramic sheets S3 for forming the cover 412 and a part of the intermediate ceramic layer 46c are prepared. As shown in FIG. 20B, the first, second, and third ceramic sheets S1, S2, and S3 are laminated to prepare an unsintered second ceramic body 41ub. The first, second, and third ceramic sheets S1, S2, and S3 have the configuration similar to that of the first embodiment. Note that the number of first, second, and third ceramic sheets S1, S2, and S3 is not limited to the example shown in FIG. 20B.

In the unsintered second ceramic body 41ub shown in FIG. 20B, the laminate in which the first and second ceramic sheets S1 and S2 are alternately laminated is formed, and the third ceramic sheets S3 corresponding to the cover 412 close to the main surface 41f are laminated on the lower surface of the laminate in the Z-axis direction. The third ceramic sheet S3 constituting a part of the intermediate ceramic layer 46c is disposed on the upper surface of the laminate in the Z-axis direction. The unsintered second ceramic body 41ub is integrated by pressure-bonding the first, second, and third ceramic sheets S1, S2, and S3.

Note that while the unsintered ceramic bodies 41ua and 41ub corresponding to the single ceramic body 41 have been described above, in actually, a multi-layer sheet configured as a large-sized sheet, which is not singulated, is formed and then singulated into unsintered ceramic bodies 41ua and 41ub.

2.3 Step S33: Application of Electrically Conductive Paste

In Step S33, an electrically conductive paste to be a plating base film is applied so as to cover the end surfaces of the unsintered first ceramic body 41ua in the X-axis direction and extend to the upper surface thereof in the Z-axis direction and both side surfaces thereof in the Y-axis direction. Similarly, the electrically conductive paste to be a plating base film is applied so as to cover the end surfaces of the unsintered second ceramic body 41ub in the X-axis direction and extend to the lower surface thereof in the Z-axis direction and both side surfaces thereof in the Y-axis direction. At that time, the electrically conductive paste is not applied to the lower surface of the unsintered first ceramic body 41ua in the Z-axis direction and the upper surface of the unsintered second ceramic body 41ub in the Z-axis direction.

2.4 Step S34: Bonding

In Step S34, the unsintered first ceramic body 41ua and the unsintered second ceramic body 41ub are bonded to each other in the Z-axis direction. For example, a ceramic paste is applied to the lower surface of the unsintered first ceramic body 41ua in the Z-axis direction, and the ceramic paste is caused to come into contact with the upper surface of the unsintered second ceramic body 41ub in the Z-axis direction. Thus, the lower surface of the unsintered first ceramic body 41ua in the Z-axis direction is bonded to the upper surface of the unsintered second ceramic body 41ub in the Z-axis direction via the ceramic paste.

2.5 Step S35: Sintering

In Step S35, the unsintered first ceramic body 41ua and unsintered second ceramic body 41ub thus bonded to each other are sintered to produce the ceramic body 41. Thus, the first capacitance forming region 411a is formed in a region corresponding to the first ceramic body 41ua. The second capacitance forming region 411b is formed in a region corresponding to the second ceramic body 41ub. Additionally, the electrically conductive paste is also sintered, and the plating base film is formed.

Here, the intermediate ceramic layer 46c including the third ceramic sheets S3 and the ceramic material for bonding is formed at the center portion of the ceramic body 41 in the Z-axis direction. In the ceramic body 41, a region in which the plating base film is discontinuous is formed along the circumference of the intermediate ceramic layer 46c.

2.6 Step S36: Formation of External Electrode

In Step S36, each of the first and second external electrodes 44 and 45 is formed by forming one or more plating films on the plating base film. Each plating film mainly contains copper, nickel, platinum, palladium, silver, gold, or the like other than tin, and is formed by electroplating, for example. The plating base film and the one or more plating films constitute the first inner layer 471. Subsequently, a tin plating film mainly containing tin is formed on the one or more plating films. The tin plating film constitutes the first outermost layer 472.

In this embodiment, the region in which the plating base film is discontinuous is formed in the circumference of the intermediate ceramic layer 46c. Thus, the plating film to be formed using the plating base film as a base is not formed in the region in which the plating base film is discontinuous. Thus, the second region 48 that does not include an electrode layer such as the plating base film or the plating film is formed.

Note that prior to Step S36, the upper plating base film in the Z-axis direction and the lower plating base film in the Z-axis direction are electrically disconnected from each other. In order to connect those disconnected plating base films prior to forming the plating film, for example, an electrically conductive thin film is formed in the region in which the plating base film is discontinuous in each of the side surfaces 41c and 41d. The electrically conductive thin film is formed by, for example, a sputtering method or a vapor-deposition method. The electrically conductive thin film also has a function of the plating base film, and thus each plating film is formed on the electrically conductive thin film. Thus, as shown in FIG. 16, the first region 47 continuous along the Z-axis direction can be formed on each of the side surfaces 41c and 41d. The main component of the electrically conductive thin film is not limited, but the same material as that of the electrically conductive paste can be used, for example.

3. Configuration of Circuit Board

Figure 21:
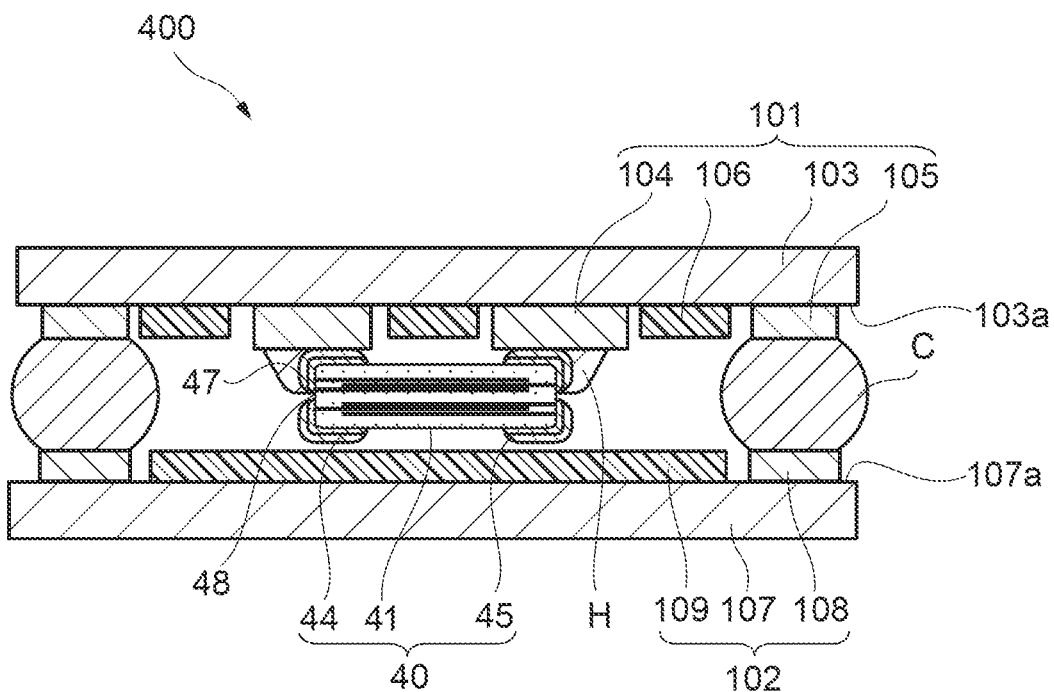
FIG. 21 is a schematic cross-sectional view of a circuit board mounting the multi-layer ceramic electronic component.

FIG. 21 is a view of a circuit board 400 of this embodiment and is a cross-sectional view corresponding to FIG. 17.

As shown in FIG. 21, the circuit board 400 includes a first board (mounting board) 101, the multi-layer ceramic capacitor 40, and a solder H that connects the first and second external electrodes 44 and 45 to the first board 101. Further, the circuit board 400 shown in FIG. 21 includes a second board 102 and a connection member C that connects the first board 101 and the second board 102 to each other.

The solder H is formed to reach the second region 48 from the first region 47 of each of the first and second external electrodes 44 and 45 of the multi-layer ceramic capacitor 40.

4. Operations and Effects of this Embodiment

As shown in FIGS. 17 and 21, in the multi-layer ceramic capacitor 40, the second region 48 of each of the first and second external electrodes 44 and 45 does not include an electrode layer. Thus, the upward spreading of the solder is more reliably suppressed by the second region 48. As a result, the solder height dimension can be reduced, and the substantive height dimension of the multi-layer ceramic capacitor 40 in the circuit board 400 can be regulated. This makes it possible to reduce a mounting space of the multi-layer ceramic capacitor 40 and to contribute to the miniaturization of the circuit board 400 and an electronic device in which the circuit board 400 is to be mounted. Additionally, since the substantive height dimension of the multi-layer ceramic capacitor 40 can be regulated, the multi-layer ceramic capacitor 40 can be suppressed from coming into contact with another structure in the circuit board 400 and can be prevented from being damaged. Further, the height dimension of the ceramic body 41 can be satisfactorily ensured, which makes it possible to contribute to the increase in capacitance of the multi-layer ceramic capacitor 40 and the improvement in bias characteristics and to satisfactorily ensure the mechanical strength of the multi-layer ceramic capacitor 40.

In addition, since the second region 48 is configured to extend in the Y-axis direction, it is possible to effectively suppress the solder from spreading upward in the Z-axis direction. Additionally, since the second region 48 is disposed at the center portion of each of the first and second external electrodes 44 and 45 in the Z-axis direction, and the first region 47 extends to both the main surfaces 41e and 41f, the degree of freedom in mounting posture of the multi-layer ceramic capacitor 40 can be enhanced.

IV Fourth Embodiment

1. Configuration of Multi-Layer Ceramic Capacitor

Figure 22:
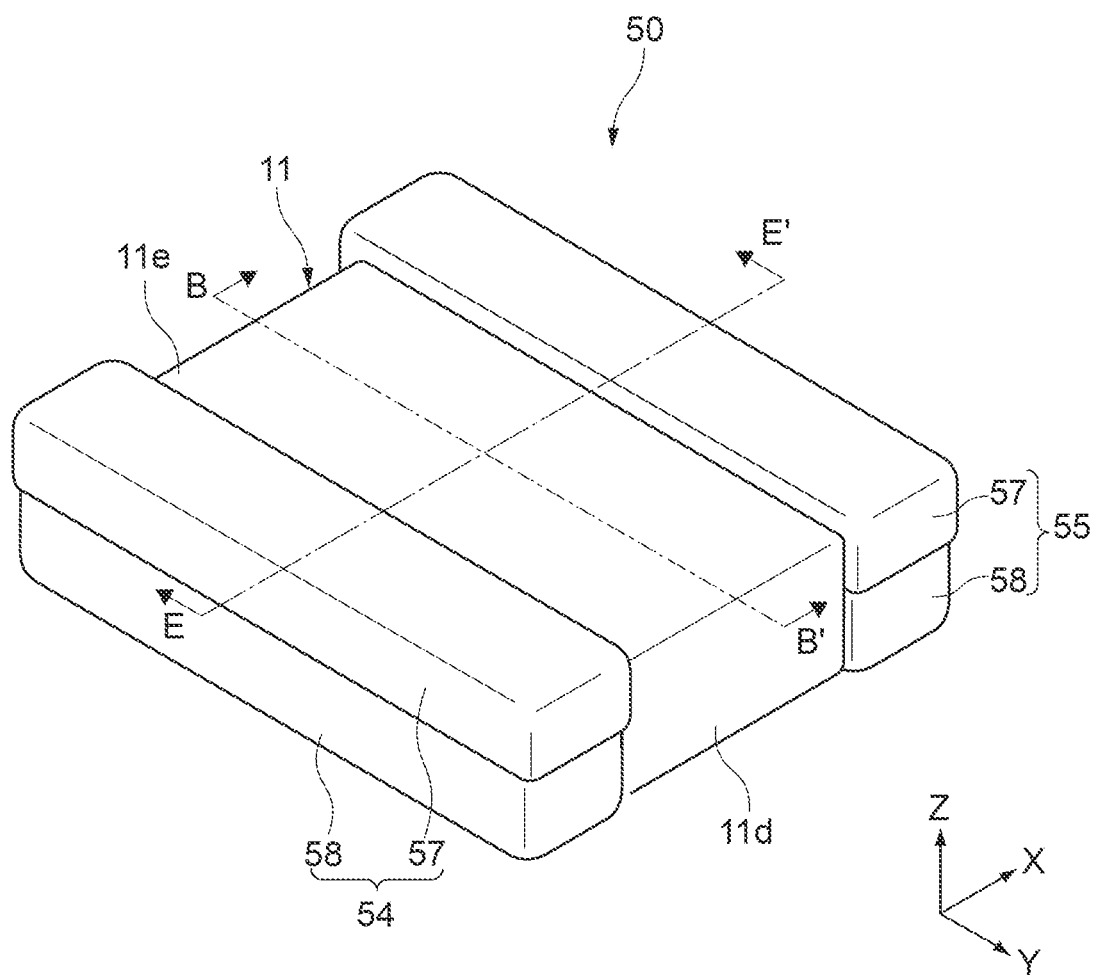
FIG. 22 is a perspective view of a multi-layer ceramic electronic component according to a fourth embodiment of the present disclosure.
Figure 23:
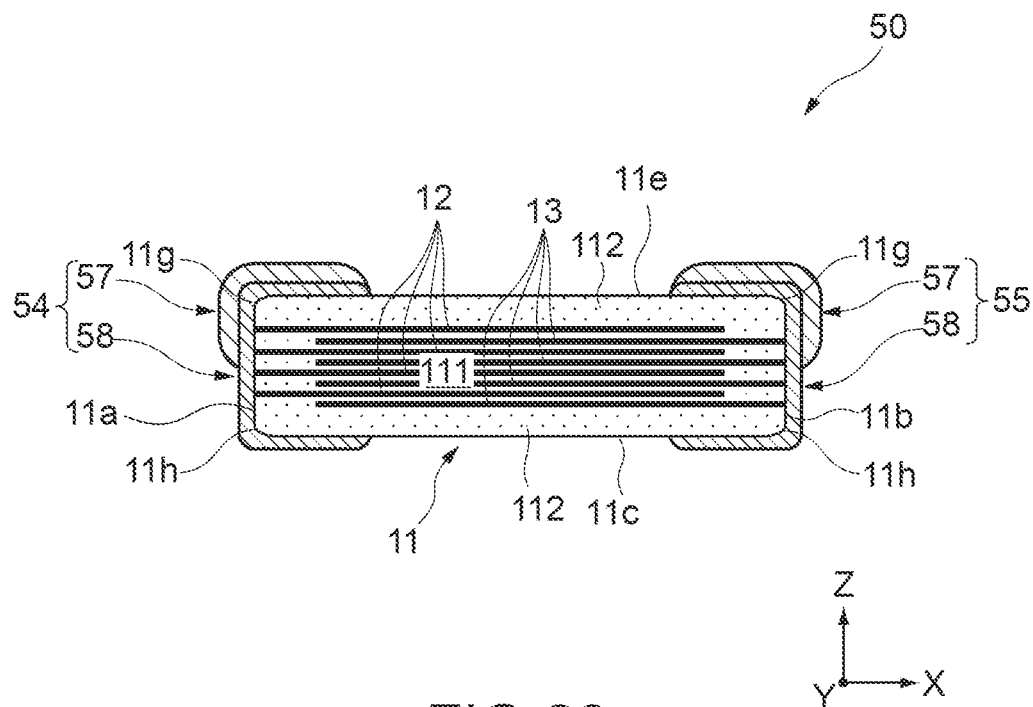
FIG. 23 is a cross-sectional view taken along the line E-E' in FIG. 22.

FIG. 22 is a perspective view of a multi-layer ceramic capacitor 50 according to a fourth embodiment of the present disclosure. FIG. 23 is a cross-sectional view of the multi-layer ceramic capacitor 50 taken along the line E-E' in FIG. 22.

The multi-layer ceramic capacitor 50 includes a ceramic body 11, a first external electrode 54, and a second external electrode 55. In this embodiment, the first external electrode 54 covers a first end surface 11a and extends to both main surfaces 11e and 11f and both side surfaces 11c and 11d. In this embodiment, the second external electrode 55 covers a second end surface 11b and extends to both the main surfaces 11e and 11f and both the side surfaces 11c and 11d.

Figure 24:
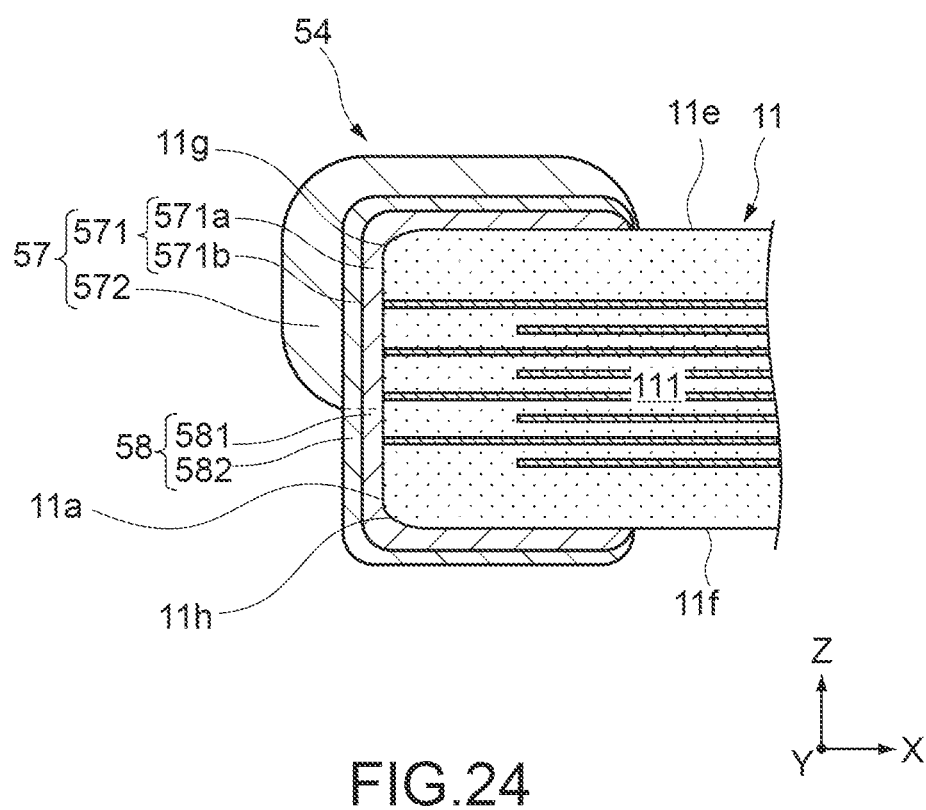
FIG. 24 is an enlarged view of a part of FIG. 23.

FIG. 24 is an enlarged view of a part of FIG. 23. Note that the configurations of the first and second external electrodes 54 and 55 are similar to each other, and thus the illustration of the second external electrode 55 is omitted in FIG. 24.

Each of the first and second external electrodes 54 and 55 includes a first region 57 and a second region 58. The first region 57 covers a first ridge 11g. The second region 58 is disposed adjacent to the first region 57 in the Z-axis direction. In this embodiment, the second region 58 is configured to be thinner than the first region 57.

In this embodiment, the second region 58 extends from the first end surface 11a or the second end surface 11b to the second main surface 11f. The second region 58 is disposed, for example, from the center portion in the Z-axis direction to the entire lower side of each of the first and second external electrodes 54 and 55. Meanwhile, the first region 57 extends from the first end surface 11a or the second end surface 11b to the first main surface 11e and is disposed from the center portion in the Z-axis direction to the entire upper side of each of the first and second external electrodes 54 and 55.

The first region 57 has a layer structure similar to that of the first region 17 of the first embodiment. In other words, the first region 57 includes a first inner layer 571 and a first outermost layer 572.

The first inner layer 571 is disposed on the ceramic body 11. The first inner layer 571 includes, for example, a first layer 571a disposed on the ceramic body, and a second layer 571b disposed on the first layer 571a. The first layer 571a includes one or more layers, for example, a plating base film and a plating film. The second layer 571b is the outermost layer of the first inner layer 571 and is formed of, for example, a nickel plating film mainly containing nickel.

The t outermost layer 572 is formed as a tin plating film mainly containing tin and is disposed on the first inner layer 571.

The second region 58 also has a layer structure similar to that of the second region 18 of the first embodiment. In other words, the second region 58 includes a second inner layer 581 disposed on the ceramic body 11, and a second outermost layer 582 disposed on the second inner layer 581.

The second inner layer 581 has a layer structure similar to that of the first layer 571a of the first region 57, for example. In other words, the second inner layer 581 includes one or more layers. In this embodiment, the second inner layer 581 includes a plating base film disposed on the ceramic body 11, and a plating film disposed on the plating base film.

The second outermost layer 582 is formed as a plating film that does not contain tin as a main component, and is formed continuously with the second layer 571b of the first inner layer 571. The second outermost layer 582 is configured as a nickel plating film mainly containing nickel, for example.

The first and second external electrodes 54 and 55 as described above are formed as follows, for example. First, a plating base film and a plating film are formed to cover the end surfaces 11a and 11b and extend to both the main surfaces 11e and 11f and both the side surfaces 11c and 11d. Those plating base film and plating film constitute the first inner layer 571 of the first region 57, and the second inner layer 581 and the second outermost layer 582 of the second region 58. Subsequently, treatment of preventing a tin plating film from being formed is performed on the second outermost layer 582 of the plating film. The tin plating film corresponding to the first outermost layer 572 of the first region 57 is then formed on the first inner layer 571. Thus, the first outermost layer 572 of the first region 57 is formed.

2. Configuration of Circuit Board

Figure 25:
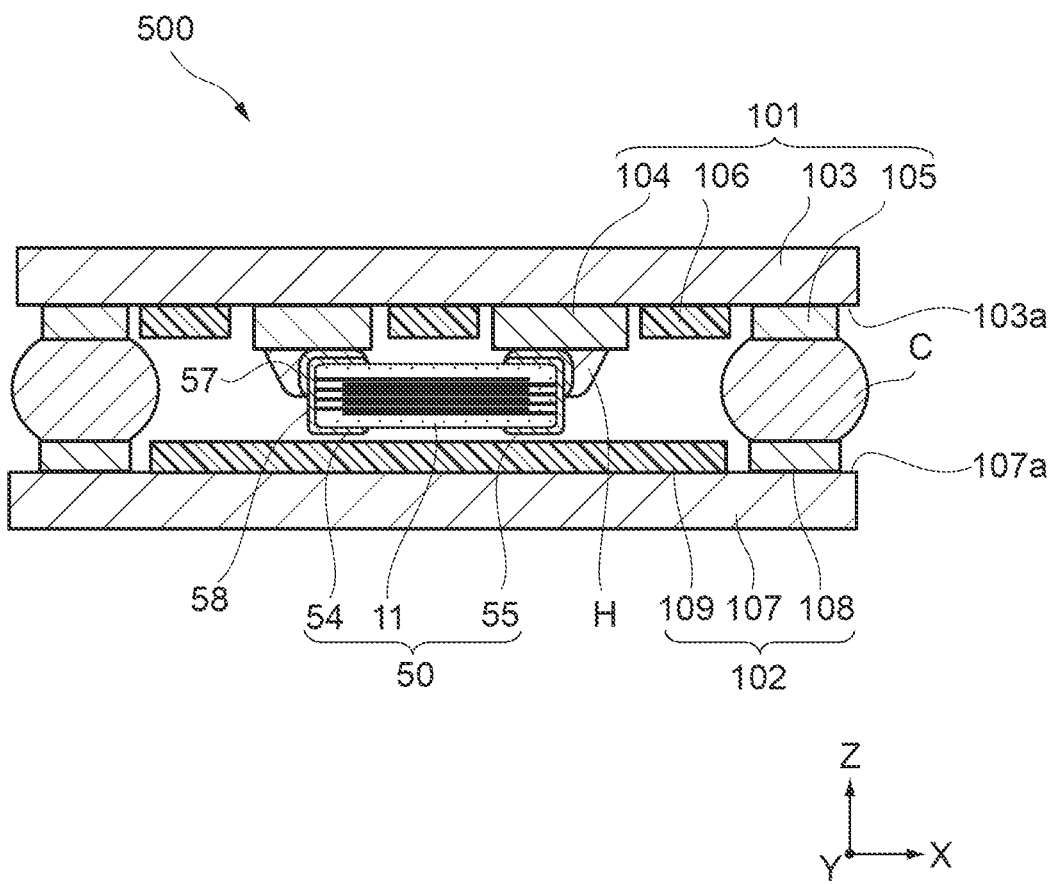
FIG. 25 is a schematic cross-sectional view of a circuit board mounting the multi-layer ceramic electronic component.

FIG. 25 is a view of a circuit board 500 of this embodiment and is a cross-sectional view corresponding to FIG. 23.

As shown in FIG. 25, the circuit board 500 includes a first board (mounting board) 101, the multi-layer ceramic capacitor 50, and a solder H that connects the first and second external electrodes 54 and 55 to the first board 101. Further, the circuit board 500 shown in FIG. 25 includes a second board 102 and a connection member C that connects the first board 101 and the second board 102 to each other. The solder H is formed to reach the second region 58 from the first region 57 of each of the first and second external electrodes 54 and 55 of the multi-layer ceramic capacitor 50.

3. Operations and Effects of this Embodiment

As shown in FIG. 25, since each of the first and second external electrodes 54 and 55 includes the second region 58, the upward spreading of the solder on the first and second external electrodes 54 and 55 is regulated. As a result, the solder height dimension can be reduced, and the substantive height dimension of the multi-layer ceramic capacitor 50 in the circuit board 500 can be regulated. This makes it possible to reduce a mounting space of the multi-layer ceramic capacitor 50 and to contribute to the miniaturization of the circuit board 500 and an electronic device in which the circuit board 500 is to be mounted. Additionally, since the substantive height dimension of the multi-layer ceramic capacitor 50 can be regulated, the multi-layer ceramic capacitor 50 can be suppressed from coming into contact with another structure in the circuit board 500 and can be prevented from being damaged. Further, the height dimension of the ceramic body 11 can be satisfactorily ensured, which makes it possible to contribute to the increase in capacitance of the multi-layer ceramic capacitor 50 and the improvement in bias characteristics and to satisfactorily ensure the mechanical strength of the multi-layer ceramic capacitor 50.

In addition, in this embodiment, the second region 58 extends from the first end surface 11a or the second end surface 11b to the second main surface 11f. This makes it possible to reliably suppress the solder from reaching the region on the second main surface 11f. Therefore, it is possible to reliably prevent the solder height dimension from being larger than the component height dimension.

V Fifth Embodiment

Figure 26A:
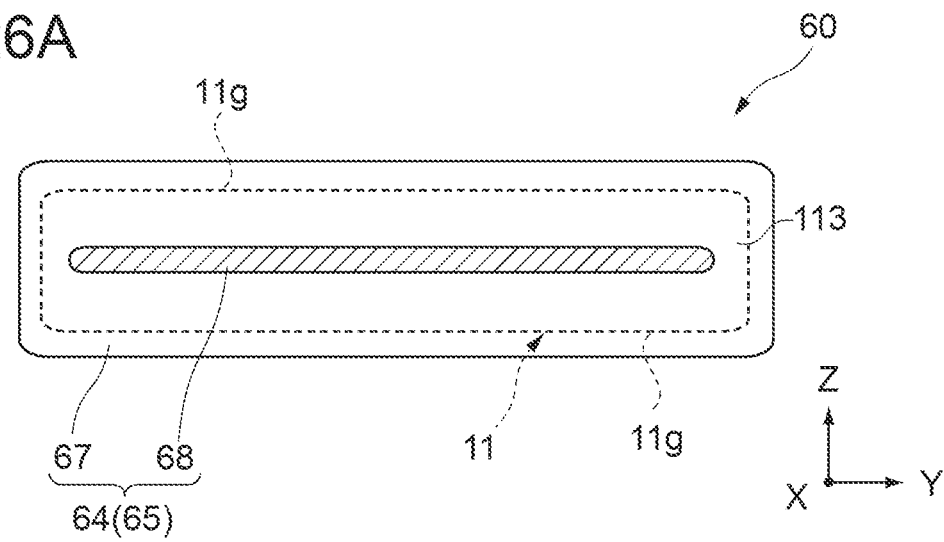
FIGS. 26A, 26B, and 26C are side views of a multi-layer ceramic electronic component according to a fifth embodiment of the present disclosure.
Figure 26B:
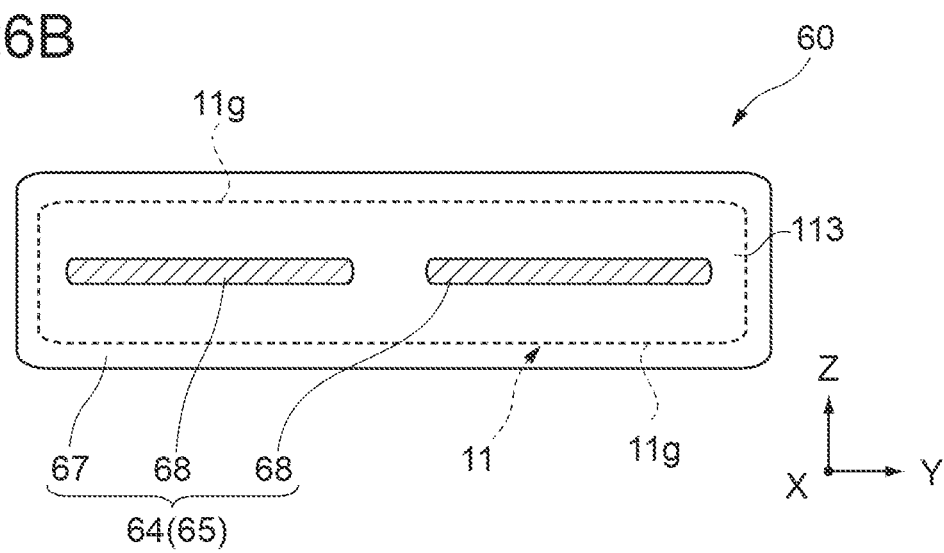
Figure 26C:
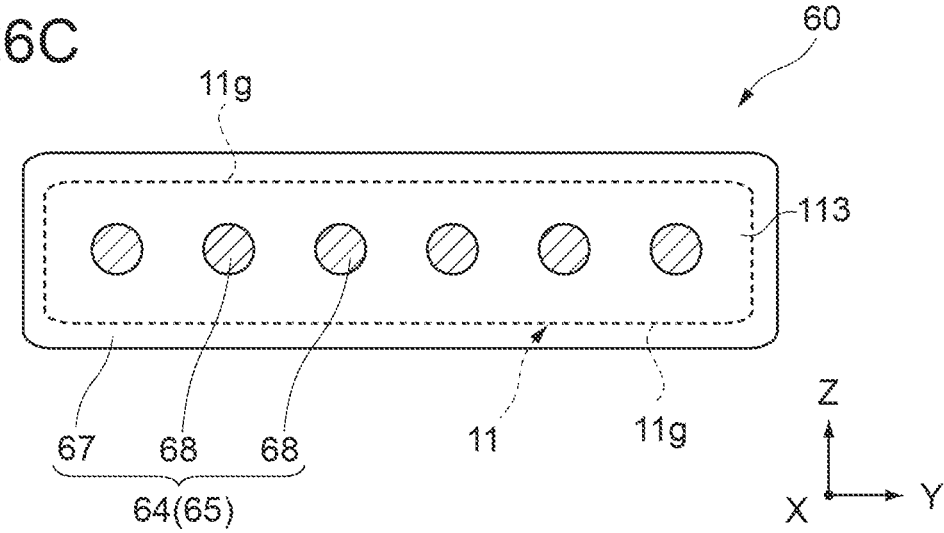

FIGS. 26A, 26B, and 26C are side views of a multi-layer ceramic capacitor 60 according to a fifth embodiment of the present disclosure when viewed from the X-axis direction. In this embodiment, an arrangement example of the second region will be described.

The multi-layer ceramic capacitor 60 includes a ceramic body 11, a first external electrode 64, and a second external electrode 65 configured in a similar manner to the first external electrode 64. Each of the first and second external electrodes 64 and 65 in this embodiment includes a first region 67 that covers a first ridge 11g, and a second region 68 disposed adjacent to the first region 67 in the Z-axis direction. Note that the second region 68 in FIGS. 26A, 26B, and 26C is hatched with oblique lines for the purpose of illustration.

As shown in FIG. 26A, the second region 68 may extend to a part of each of the first and second external electrodes 64 and 65 in the Y-axis direction, for example.

Alternatively, as shown in FIGS. 26B and 26C, a plurality of second regions 68 may be disposed apart from each other in the Y-axis direction. In this case, each second region 68 may be formed in a band-like shape extending in the Y-axis direction as shown in FIG. 26B or may have a planar shape of a dot or the like as shown in FIG. 26C.

The multi-layer ceramic capacitor 60 may also be mounted on a circuit board similar to that of the first embodiment, for example.

Those second regions 68 also regulate the upward spreading of the solder on the first and second external electrodes 64 and 65. As a result, the solder height dimension can be reduced, and the substantive height dimension of the multi-layer ceramic capacitor 60 in the circuit board can be regulated. This makes it possible to reduce a mounting space of the multi-layer ceramic capacitor 60 and to contribute to the miniaturization of the circuit board and an electronic device in which the circuit board is to be mounted. Additionally, the multi-layer ceramic capacitor 60 can be prevented from being damaged by a structure in the circuit board. Further, the height dimension of the ceramic body 11 can be satisfactorily ensured, which makes it possible to contribute to the increase in capacitance of the multi-layer ceramic capacitor 60 and the improvement in bias characteristics and to satisfactorily ensure the mechanical strength of the multi-layer ceramic capacitor 60.

VI Sixth Embodiment

1. Configuration of Circuit Board

Figure 27:
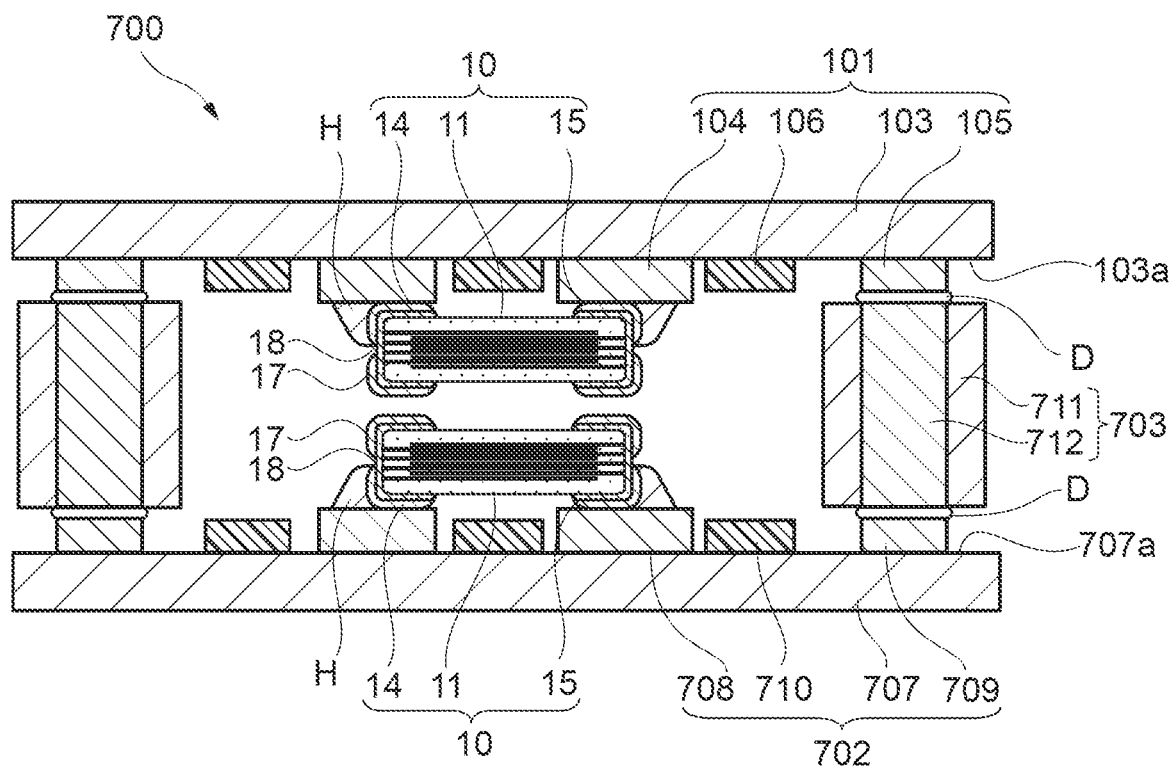
FIG. 27 is a cross-sectional view of a circuit board according to a sixth embodiment of the present disclosure.

FIG. 27 is a cross-sectional view of a circuit board 700 according to a sixth embodiment of the present disclosure. The circuit board 700 of this embodiment further includes a frame-shaped core board between a first board 101 and a second board 702.

As shown in FIG. 27, the circuit board 700 includes the first board (first mounting board) 101, the two multi-layer ceramic capacitors 10, and a solder H that connects the first and second external electrodes 14 and 15 to the first board 101. Further, the circuit board 700 shown in FIG. 27 includes the second board (second mounting board) 702, a third board 703, and connection members D that connect the first board 101 and the third board 703 to each other and the second board 702 and the third board 703 to each other.

The first board 101 mounts one of the multi-layer ceramic capacitors 10. The first board 101 includes a board body 103 having a first mount surface 103a facing in the Z-axis direction, a component mounting land 104 disposed on the first mount surface 103a, a board connecting land 105 disposed on the first mount surface 103a, and a solder resist 106 disposed around the component mounting land 104 and the board connecting land 105 on the first mount surface 103a. A circuit (not shown) is formed on the board body 103.

The second board 702 mounts the other multi-layer ceramic capacitor 10. The second board 702 includes a board body 707 having a second mount surface 707a facing the first mount surface 103a in the Z-axis direction, a component mounting land 708 disposed on the second mount surface 707a, a board connecting land 709 disposed on the second mount surface 707a, and a solder resist 710 disposed around the component mounting land 708 and the board connecting land 709 on the second mount surface 707a. A circuit (not shown) is formed on the board body 707.

The third board 703 is disposed between the first board 101 and the second board 702 and configured as a core board in which a space for housing a component is formed. The third board 703 includes a frame-shaped board body 711 and a through-hole 712 formed to penetrate the board body 711 in the Z-axis direction. An electrically conductive material made of copper or the like is embedded in the through-hole 712. The through-holes 712 are disposed along the side wall of the board body 711, for example.

The connection members D connect the through-hole 712 of the third board 703 to the board connecting land 105 of the first board 101 and to the board connecting land 709 of the second board 702. The connection members D are formed of a solder, for example.

Of the two multi-layer ceramic capacitors 10, one of the multi-layer ceramic capacitors 10 is mounted on the component mounting land 104 of the first board 101 via the solder H. The other multi-layer ceramic capacitor 10 is mounted on the component mounting land 708 of the second board 702 via the solder H.

In the production of such a circuit board 700, a solder paste is applied onto the component mounting land 104 of the first board 101 and the component mounting land 708 of the second board 702, and the multi-layer ceramic capacitors 10 are disposed on the solder paste. The solder paste is then heated and melted. At that time, the solder paste spreads upward in the Z-axis direction on the first and second external electrodes 14 and 15, and thus the solder H is formed. The solder H is formed to reach the second region 18 from the first region 17 of each of the first and second external electrodes 14 and 15 of the multi-layer ceramic capacitors 10.

2. Operations and Effects of this Embodiment

Since each of the first and second external electrodes 14 and 15 includes the second region 18 in this embodiment as well, the upward spreading of the solder on the first and second external electrodes 14 and 15 is regulated. As a result, the solder height dimension can be reduced, and the substantive height dimension of the multi-layer ceramic capacitor 10 in the circuit board 700 can be regulated. This makes it possible to reduce a mounting space of the multi-layer ceramic capacitor 10 and to contribute to the miniaturization of the circuit board 700 and an electronic device in which the circuit board 700 is to be mounted. Additionally, since the substantive height dimension of the multi-layer ceramic capacitor 10 can be regulated, the two multi-layer ceramic capacitors 10 can be suppressed from coming into contact with each other or with another structure and can be prevented from being damaged. Further, the height dimension of the ceramic body 11 can be satisfactorily ensured, which makes it possible to contribute to the increase in capacitance of the multi-layer ceramic capacitor 10 and the improvement in bias characteristics and to satisfactorily ensure the mechanical strength of the multi-layer ceramic capacitor 10.

VII Other Embodiments

While the embodiments of the present disclosure have been described, the present disclosure is not limited to the embodiments described above, and it should be appreciated that the present disclosure may be variously modified without departing from the gist of the present disclosure. For example, the embodiment of the present disclosure can be an embodiment in which some embodiments are combined.

Each layer of the first region and the second region is not limited to the examples described above. For example, the first region only needs to include a first outermost layer mainly containing tin, and the lower layer of the first outermost layer only needs to include one or more optional electrically conductive layers. Additionally, the second region only needs to be free from an outermost layer mainly containing tin, and in a case where the second region includes an electrically conductive layer, only needs to include one or more optional electrically conductive layers.

The second region only needs to be arranged adjacent to the first region in the Z-axis direction on the end surface, and the arrangement thereof is not limited to the forms described in the embodiments described above. For example, the second region may be disposed not at the center portion of the external electrode in the Z-axis direction but in the vicinity of the first ridge or the second ridge.

Additionally, the external electrode only needs to extend from the end surface to at least the first main surface, and may be configured not to extend to the second main surface.

The multi-layer ceramic capacitor 10 does not need to have a low height, and the shape and size of the multi-layer ceramic capacitor 10 are not limited to the examples described above.

In the embodiments described above, the multi-layer ceramic capacitor has been described as an example of a multi-layer ceramic electronic component, but the present disclosure can be applied to any other multi-layer ceramic electronic components each including a pair of external electrodes. Examples of such multi-layer ceramic electronic components include a chip varistor, a chip thermistor, and a multi-layer inductor.

What is claimed is:

1. A multi-layer ceramic electronic component, comprising:
 a ceramic body including
  a first internal electrode and a second internal electrode laminated in a direction of a first axis,
  a first main surface and a second main surface facing in the direction of the first axis,
  a first end surface facing in a direction of a second axis orthogonal to the first axis, the first internal electrode being drawn to the first end surface,
  a second end surface facing in the direction of the second axis, the second internal electrode being drawn to the second end surface, and
  a first side surface and a second side surface facing each other in a direction of a third axis orthogonal to the first axis and the second axis;
 a first external electrode that covers the first end surface and extends to the first main surface, the first side surface, and the second side surface; and
 a second external electrode that covers the second end surface and extends to the first main surface, the first side surface, and the second side surface, wherein
 each of the first external electrode and the second external electrode includes
  a first region that includes a first outermost layer mainly containing tin and extends from the first end surface or the second end surface to the first main surface, and
  a second region that is free from an outermost layer mainly containing tin and is disposed adjacent to the first region in the direction of the first axis on the first end surface or the second end surface, wherein the second region includes a second outermost layer free from tin as a main component, and the first region further includes a first inner layer disposed on the ceramic body, wherein the second region further includes a second inner layer disposed on the ceramic body and formed continuously with the first inner layer, and a tin-containing layer mainly containing tin, disposed on the second inner layer, and formed continuously with the first outermost layer, and wherein the second outermost layer is disposed on the tin-containing layer, and omitted on the first side surface and the second side surface.

2. The multi-layer ceramic electronic component according to claim 1, wherein the second region extends along a direction of the third axis on the first end surface or the second end surface.

3. The multi-layer ceramic electronic component according to claim 1, wherein the first external electrode covers the first end surface and extends to the first main surface and the second main surface, the second external electrode covers the second end surface and extends to the first main surface and the second main surface, the second region is disposed at the center portion of each of the first external electrode and the second external electrode in the direction of the first axis, and the first region extends from the first end surface or the second end surface to the first main surface and the second main surface.

4. The multi-layer ceramic electronic component according to claim 3, wherein the center portion is a region at the center when each of the first external electrode and the second external electrode is divided equally into three in the direction of the first axis.

5. The multi-layer ceramic electronic component according to claim 1, wherein the second outermost layer contains a metal other than tin.

6. A multi-layer ceramic electronic component, comprising:

a ceramic body including a capacitance forming unit including a first internal electrode and a second internal electrode laminated in a direction of a first axis, a first main surface and a second main surface facing in the direction of the first axis a first end surface facing in a direction of a second axis orthogonal to the first axis, the first internal electrode being drawn to the first end surface, and a second end surface facing in the direction of the second axis, the second internal electrode being drawn to the second end surface;

a first external electrode that covers the first end surface and extends to the first main surface; and a second external electrode that covers the second end surface and extends to the first main surface, wherein each of the first external electrode and the second external electrode includes a first region that includes a first outermost layer mainly containing tin and extends from the first end surface or the second end surface to the first main surface, and a second region that is free from an outermost layer mainly containing tin and is disposed adjacent to the first region in the direction of the first axis on the first end surface or the second end surface, wherein the first external electrode covers the first end surface and extends to the first main surface and the second main surface, the second external electrode covers the second end surface and extends to the first main surface and the second main surface, the second region extends from the first end surface or the second end surface to the second main surface, an edge of the first outermost layer is positioned on the first end surface or the second end surface, and the first outermost layer is positioned on the first end surface or the second end surface in a manner to overlap the capacitance forming unit as viewed in the direction of the second axis.

7. The multi-layer ceramic electronic component according to claim 6 wherein the edge of the first outermost layer is positioned on the second main surface side of the first end surface or the second end surface other than the center line bisecting the first end surface or the second end surface in the first axial direction.

8. The multi-layer ceramic electronic component according to claim 6 wherein the first outermost layer covers more than half of the capacitance forming unit in the first axial direction on the first end surface or the second end surface.

9. The multi-layer ceramic electronic component according to claim 6 wherein the second region includes a second outermost layer consisting of a plating layer that is free from tin as a main component.

10. The multi-layer ceramic electronic component according to claim 6 wherein the second region is thinner than the first region on the first end surface or the second end surface.

11. A circuit board, comprising:

a mounting board;

a multi-layer ceramic electronic component including a ceramic body including a first internal electrode and a second internal electrode laminated in a direction of a first axis, a first main surface and a second main surface facing in the direction of the first axis, a first end surface facing in a direction of a second axis orthogonal to the first axis, the first internal electrode being drawn to the first end surface, a second end surface facing in the direction of the second axis, the second internal electrode being drawn to the second end surface, and a first side surface and a second side surface facing each other in a direction of a third axis orthogonal to the first axis and the second axis;

a first external electrode that covers the first end surface and extends to the first main surface, the first side surface, and the second side surface, and a second external electrode that covers the second end surface and extends to the first main surface, the first side surface, and the second side surface; and a solder that connects the first external electrode and the second external electrode to the mounting board, wherein each of the first external electrode and the second external electrode includes a first region that includes a first outermost layer mainly containing tin and extends from the first end surface or the second end surface to the first main surface, and a second region that is free from an outermost layer mainly containing tin and is disposed adjacent to the first region in the direction of the first axis on the first end surface or the second end surface, wherein the second region includes a second outermost layer free from tin as a main component, and the first region further includes a first inner layer disposed on the ceramic body, wherein the second region further includes a second inner layer disposed on the ceramic body and formed continuously with the first inner layer, and a tin-containing layer mainly containing tin, disposed on the second inner layer, and formed continuously with the first outermost layer, and wherein the second outermost layer is disposed on the tin-containing layer, and omitted on the first side surface and the second side surface.

\* \* \* \* \*